(12) United States Patent
Kim et al.

(10) Patent No.: US 10,079,237 B2
(45) Date of Patent: Sep. 18, 2018

(54) SEMICONDUCTOR MEMORY DEVICE

(71) Applicant: Samsung Electronics Co., Ltd., Suwon-si (KR)

(72) Inventors: Ji-hoon Kim, Geoje-si (KR); Won-chul Lee, Seongnam-si (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/645,261

(22) Filed: Jul. 10, 2017

(65) Prior Publication Data
US 2018/0019243 A1    Jan. 18, 2018

(30) Foreign Application Priority Data
Jul. 12, 2016 (KR) .................. 10-2016-0088047

(51) Int. Cl.
| | | |
|---|---|---|
| H01L 49/02 | (2006.01) | |
| H01L 27/108 | (2006.01) | |
| H01L 23/00 | (2006.01) | |

(52) U.S. Cl.
CPC ...... *H01L 27/10808* (2013.01); *H01L 23/562* (2013.01); *H01L 27/10852* (2013.01); *H01L 28/86* (2013.01); *H01L 28/90* (2013.01)

(58) Field of Classification Search
CPC .............. H01L 23/562; H01L 27/108; H01L 27/10808; H01L 27/10852; H01L 27/101; H01L 28/86; H01L 28/90
See application file for complete search history.

(56) References Cited

U.S. PATENT DOCUMENTS

| | | | |
|---|---|---|---|
| 7,115,970 B2 | 10/2006 | Gilgen et al. | |
| 7,282,444 B2 | 10/2007 | Tanida et al. | |
| 8,169,012 B2 | 5/2012 | Bae et al. | |
| 8,384,143 B2 | 2/2013 | Hirota | |
| 9,018,733 B1 | 4/2015 | Lee et al. | |
| 2001/0044181 A1* | 11/2001 | Nakamura | H01L 27/10894 438/253 |
| 2008/0009119 A1* | 1/2008 | Eto | H01L 27/10852 438/386 |
| 2009/0184393 A1 | 7/2009 | Chen et al. | |

(Continued)

FOREIGN PATENT DOCUMENTS

| | | |
|---|---|---|
| JP | 2005-167093 | 6/2005 |
| JP | 2013-048189 | 3/2013 |
| KR | 10-2009-0044553 | 5/2009 |

(Continued)

*Primary Examiner* — Galina Yushina
(74) *Attorney, Agent, or Firm* — Muir Patent Law, PLLC

(57) ABSTRACT

A semiconductor memory device may include: a substrate having a cell area defined thereon, the cell area including a cell block area and an edge area; a plurality of bottom electrodes, on the substrate, which are in parallel with a top surface of the substrate and a first direction in parallel with a top surface of the substrate, and are arranged along a second direction intersecting the first direction; and a support structure pattern, in a flat plate shape, which connects the bottom electrodes to each other, supports the bottom electrodes onto the substrate, and includes a plurality of open areas, wherein a first profile, which is a horizontal cross-sectional profile in the edge area of the support structure pattern, has a wave shape.

20 Claims, 29 Drawing Sheets

(56) References Cited

U.S. PATENT DOCUMENTS

2012/0049380 A1* 3/2012 Kim .................. H01L 27/0207
　　　　　　　　　　　　　　　　　　　　　257/773
2013/0052785 A1 2/2013 Mashiko et al.

FOREIGN PATENT DOCUMENTS

| KR | 10-0925032 | 11/2009 |
|----|------------|---------|
| KR | 10-1262225 | 5/2013  |

* cited by examiner

SEMICONDUCTOR MEMORY DEVICE

CROSS-REFERENCE TO RELATED APPLICATION

This application claims the benefit of priority under 35 U.S.C. § 119 to Korean Patent Application No. 10-2016-0088047, filed on Jul. 12, 2016, in the Korean Intellectual Property Office (KIPO), the disclosure of which is incorporated herein in its entirety by reference.

BACKGROUND

The disclosed concepts relate to a semiconductor memory device, and more particularly, to a semiconductor memory device including a support structure pattern to prevent a collapse of lower electrodes.

Recently, as an integration of memory devices has been accelerated due to the rapid development of micronized semiconductor process technology, the size of a unit cell has been significantly reduced and an operating voltage has been noticeably lowered. For example, the level of integration of semiconductor memory devices, such as dynamic random access memory (DRAM), has increased and areas occupied by devices have decreased, while capacitance has been required to be maintained or increased.

Some example embodiments provide a semiconductor memory device having enhanced reliability by improving operation defects of information storage components and simultaneously enhancing the level of integration.

SUMMARY

In some aspects, the disclosure is directed to a semiconductor memory device, the device comprising: a substrate having a cell area defined thereon, the cell area including a cell block area and an edge area; a plurality of bottom electrodes formed on the substrate, wherein the plurality of bottom electrodes are arranged in rows that extend in a first direction parallel with a top surface of the substrate, arranged in columns that extend in a second direction parallel with the top surface of the substrate and perpendicular to the first direction; and a support structure pattern having a flat plate shape, wherein the support structure pattern connects the bottom electrodes to each other, supports the bottom electrodes on the substrate, and comprises a plurality of open areas, wherein a first profile, which is a horizontal cross-sectional profile of the support structure pattern, from a plan view, has a wave shape in the edge area of the support structure pattern In some aspects, the disclosure is directed to a semiconductor memory device the semiconductor memory device comprising: a first bottom electrode array which comprises first bottom electrodes separated from each other by a first gap along a first direction on a substrate and separated from each other by a second gap along a second direction perpendicular to the first direction; a second bottom electrode array which comprises second bottom electrodes separated from each other by a third gap along a first direction on the substrate and separated from each other by a fourth gap along the second direction between adjacent first bottom electrodes of the first bottom electrode array; and a support structure pattern on the substrate between the first bottom electrodes and the second bottom electrodes, wherein the first bottom electrodes and the second bottom electrodes are misaligned relative to each other with respect to the first direction, and wherein horizontal distances along the second direction from the outermost first and second bottom electrodes to an outermost perimeter of the support structure pattern are the same.

In some aspects, the disclosure is directed to a semiconductor memory device the semiconductor memory device comprising: a substrate having a cell area defined thereon, the cell area including a cell block area and an edge area extending around a perimeter of the cell block area; a first bottom electrode array which comprises first bottom electrodes separated from each other by a first gap along a first direction on the substrate and separated from each other by a second gap along a second direction perpendicular to the first direction; a second bottom electrode array which comprises second bottom electrodes separated from each other by a third gap along a first direction on the substrate and separated from each other by a fourth gap along the second direction between adjacent first bottom electrode arrays; and a support structure pattern in contact with upper sidewalls of the first and second bottom electrodes, which physically connects the first bottom electrodes and the second bottom electrodes, and supports the first and second bottom electrodes on the substrate, wherein a first profile, which is a horizontal cross-sectional profile in the edge area of the support structure pattern, has a wave shape comprised of linear segments.

BRIEF DESCRIPTION OF THE DRAWINGS

Example embodiments will be more clearly understood from the following detailed description taken in conjunction with the accompanying drawings in which.

DETAILED DESCRIPTION OF THE EMBODIMENTS

Figure 1A:
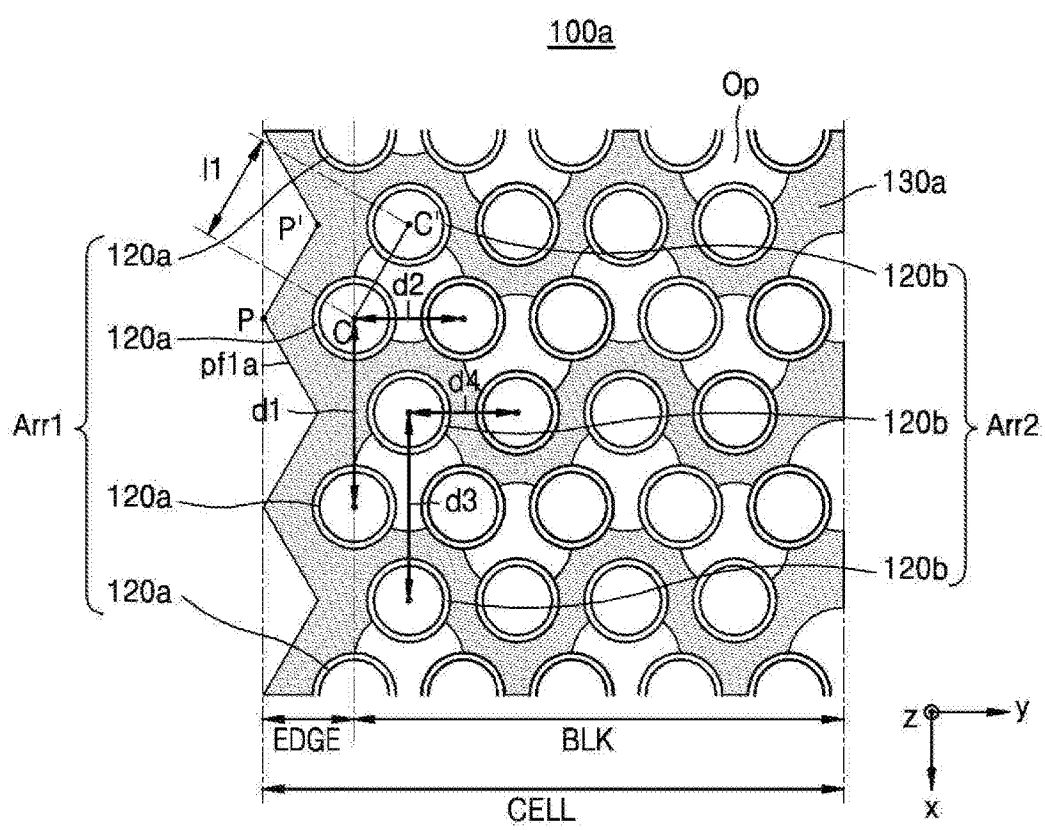
FIG. 1A is a plan view of a semiconductor memory device, according to an example embodiment.

As used herein, the terms "material continuity" and "materially in continuity" may refer to structures, patterns, and/or layers that are formed at the same time and of the same material, without a break in the continuity of the material of which they are formed. As one example, structures, patterns, and/or layers that are in "material continuity" or "materially in continuity" may be homogeneous monolithic structures.

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," in or "directly on" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a connection contact (i.e., touching) unless the context indicates otherwise.

Hereinafter, the concepts will be described in detail by explaining exemplary embodiments with reference to the attached drawings. Like reference numerals in the drawings denote like elements.

FIG. 1A is a plan view of a support structure pattern of a semiconductor memory device 100a according to an embodiment.

Referring to FIG. 1A, the semiconductor memory device 100a may include a substrate on which a cell area CELL and a peripheral circuit area (not illustrated in FIG. 1A; see FIG. 4) are defined. In this case, the cell area CELL may include a cell block area BLK and an edge area EDGE. The edge area EDGE may be defined by edges of the cell area CELL. The block area BLK may represent a region surrounded by the edge area EDGE. For example, the edge area EDGE may extend along a perimeter of the block area BLK and surround the block area BLK. Only one side of the edge area EDGE is illustrated for the sake of convenience, and the edge area EDGE may be defined as having a total of four edges or edge sections which are, for example, two edges along a first direction (an x-direction) and two edges along a second direction (a y-direction). However, the embodiment is not limited thereto. For example, when the cell block area BLK does not have a rectangular shape, depending on requirements such as necessity in a process and/or applicability to a product, the edge area EDGE may be defined by more than or less than four edges.

Figure 12:
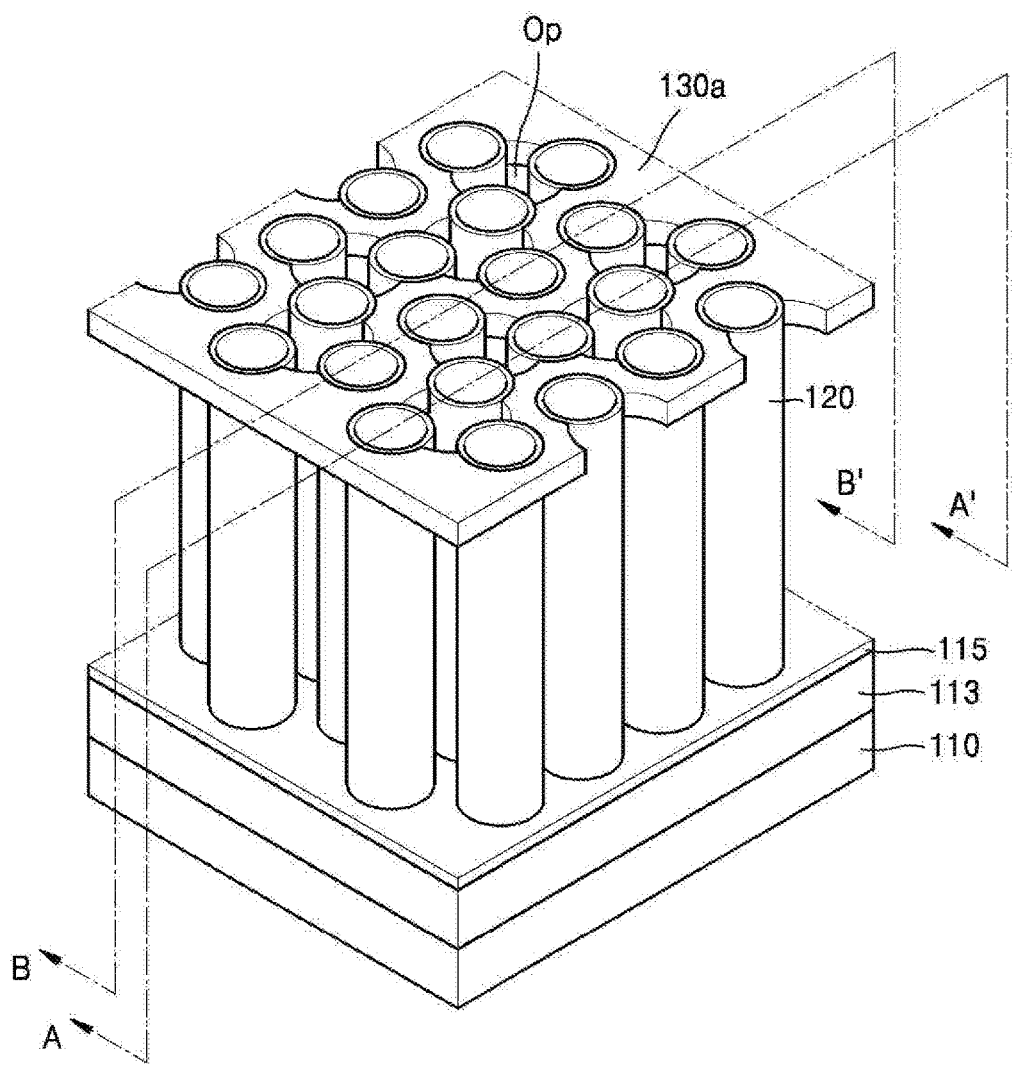
FIG. 12 is a perspective view of bottom electrodes of a semiconductor memory device according to an example embodiment.

The semiconductor memory device 100a may include a charge storage element (e.g., a capacitor) on the substrate. In some embodiments, the charge storage element may be located in the cell block area BLK. The capacitor may include storage electrodes, for example, first and second bottom electrodes 120a and 120b, having a cylinder-type structure for an increased capacitance. In the semiconductor memory device 100a according to an embodiment, the first and second bottom electrodes 120a and 120b may include only cylinder-type bottom electrodes 120, as illustrated in FIG. 12, or may also include pillar-type bottom electrodes (see, e.g., first and second bottom electrodes 120A and 120B in FIG. 14) at bottom portions of cylinder-type bottom electrodes. Hereinafter, the embodiments of both the pillar-type and cylinder-type bottom electrodes will be referred to as the bottom electrodes for the sake of convenience. The first and second bottom electrodes 120a and 120b may arranged in parallel with respect to the first direction (the x-direction). For example, rows including the first and second bottom electrodes 120a and 120b may be formed in parallel with one another across a top surface of the substrate, and may extend in the first direction (e.g., x-direction). The rows of electrodes may be arranged in an array along the second direction (the y-direction), in parallel with the top surface of the substrate and perpendicular to the first direction (the x-direction), intersecting the first direction, to form rows and columns. The first and second bottom electrodes 120a and 120b may be arranged symmetrically and uniformly, as will be explained in further detail below.

The bottom electrodes (for example, 120a) on any one row may be misaligned or offset relative to bottom electrodes (for example, 120b) on another adjacent row to secure a space between the first and second bottom electrodes 120a and 120b. In other words, x-coordinates of the first bottom electrodes 120a on any one row may be different from those of the second bottom electrodes 120b on another adjacent row. A relatively large space between the first and second bottom electrodes 120a and 120b may be secured by misaligning the first and second bottom electrodes 120a and 120b relative to each other and may contribute to a uniform deposition of a dielectric material (not illustrated) in subsequent processes such as a dielectric deposition process.

In addition, the first and second bottom electrodes 120a and 120b may form a honeycomb structure which is arranged by vertices and a center of a hexagon pattern. The hexagon pattern may provide a template by which to arrange the first and second bottom electrodes 120a and 120b such that the vertices and center points of each of the first and second bottom electrodes 120a and 120b are aligned with points of a repeating hexagon pattern. For example, the plurality of first and second bottom electrodes 120a and 120b may be arranged symmetrically and uniformly such that six first and second bottom electrodes 120a and 120b form the perimeter of hexagonal structure around a single bottom electrode 120, and overlapping hexagonal structures comprised of sets of seven first and second bottom electrodes 120a and 120b (the six bottom electrodes 120 along the perimeter and the one bottom electrodes 120 at the center) form the honeycomb structure. The honeycomb structure of the first and second bottom electrodes 120a and 120b will be described in more detail in FIG. 12.

As described above, an aspect ratio of the first and second bottom electrodes 120a and 120b may be very large. For example, the aspect ratio of each of the first and second bottom electrodes 120a and 120b may be about 10 to about 30. In addition, widths of each of the first and second bottom electrodes 120a and 120b may be approximately about 20 nm to about 100 nm, and heights of each of the first and second bottom electrodes 120a and 120b may be approximately about 500 nm to about 4000 nm. However, sizes of structures of the first and second bottom electrodes 120a and 120b according to an embodiment are not limited thereto.

As the aspect ratio of the first and second bottom electrodes 120a and 120b increases, the first and second bottom electrodes 120a and 120b may collapse or fracture. Accordingly, the semiconductor memory device 100a according to an embodiment may further include a support structure pattern 130a to prevent the collapse of the first and second bottom electrodes 120a and 120b.

The support structure pattern 130a may be formed in a one-body type including a large number of open areas Op, as illustrated. For example, the whole structure of the support structure pattern 130a may be physically connected or in material continuity. The open area Op may be formed according to certain rules depending on design requirements, and each of the open areas Op may expose three of the first and second bottom electrodes 120a and 120b depending on one embodiment. In this case, prior to deposition of a dielectric layer (not illustrated) and a top electrode (not illustrated), the open area Op of the support structure pattern 130a may expose the first and second bottom electrodes 120a and 120b. After the dielectric layer (not illustrated) and the top electrode (not illustrated) have been formed, the first and second bottom electrodes 120a and 120b may be covered by the dielectric layer (not illustrated) and the top electrode (not illustrated), and accordingly, the first and second bottom electrodes 120a and 120b may not be exposed via the open area Op.

The support structure pattern 130a may be formed on top end sides of the first and second bottom electrodes 120a and 120b (see, e.g., support structure pattern 130a illustrated in FIG. 12), and function as a structure supporting spaces between the first and second bottom electrodes 120a and 120b. For example, the support structure pattern 130a may be formed at a level in the z-direction, and may extend in the x- and y-directions in parallel with a top surface of the substrate 110, as further illustrated in FIG. 12. The level in the z-direction may coincide with a top surface of the first and second bottom electrodes 120a and 120b, or may be below the top surface of the first and second bottom electrodes 120a and 120b. Accordingly, the support structure pattern 130a may expose top surfaces of the first and second bottom electrodes 120a and 120b. The top surfaces of the first and second bottom electrodes 120a and 120b may be substantially coplanar with one another.

The open area Op may have a structure such that a portion of each of three first and second bottom electrodes 120a and 120b is exposed; for example, a portion of a side surface thereof is exposed. A level (in the z-direction) of the openings of the side surfaces of the first and second bottom electrodes 120a and 120b via the open area Op may vary depending on the structure and an arrangement of the open area Op.

In this example, the length of the opening of the side surfaces of the first and second bottom electrodes 120a and 120b may be defined by a length of a portion which is not connected by the support structure pattern 130a, based on a horizontal cross-section of the first and second bottom electrodes 120a and 120b, that is, a total length of a circular ring. For example, when all of the horizontal cross-sections of the first and second bottom electrodes 120a and 120b are connected to each other, the first and second bottom electrodes 120a and 120b may be denoted as not-exposed. When a half of the horizontal cross-sections of the first and second bottom electrodes 120a and 120b (e.g., portions corresponding to semicircles) are connected to the support structure pattern 130a, the side surface of the first and second bottom electrodes 120a and 120b may be denoted as half-exposed via the open area Op. As can be seen, in one embodiment, at the level in the z-direction where the support structure pattern 130a is formed, more than half of side surfaces of some of the first and second bottom electrodes 120a and 120b are exposed by open areas Op, and less than half of side surfaces of other of the first and second bottom electrodes 120a and 120b are exposed by open areas Op.

The support structure pattern 130a is illustrated as being provided in one layer; however, the embodiment is not limited thereto. More than two layers may be provided depending on characteristics of the capacitor (e.g., the aspect ratio, the height, etc.). For example, the semiconductor memory device 100a may further include a support structure pattern which is formed to contact the side surface at an intermediate level between top ends and bottom ends of first and second bottom electrodes 120a and 120b. Only one layer will be illustrated for the sake of convenience in this disclosure.

A first profile pf1a, which is a cross-sectional profile of the support structure pattern 130a in the edge area EDGE, may include a wave form. The wave form may denote that a particular form is repeated with periodicity. For example, the wave form may include a triangular wave, a sine wave, a saw-tooth wave, and a square wave, or various forms having a combination of these waves. In example embodiments, the first profile pf1a may include various forms composed of a triangular wave, a sine wave, a saw-tooth wave, and a square wave, or a combination of these waves. Alternatively, the first profile pf1a may include, in part, a wave form such that a concave portion of the support structure pattern 130a along a direction of the cell block area BLK corresponds to a location of a conductive contact MC (see, e.g., FIG. 4). These wave forms are described as they appear in a plan view. In addition, a profile of outermost bottom electrodes most adjacent to the edge area EDGE may have the same profile as the first profile pf1a (e.g., a wave form, which may be the same wave form as the first profile pf1a).

Depending on the case, locations of the centers of the outermost first and second bottom electrodes 120a and 120b may correspond to the concavo-convex features of the first profile pf1a with respect to the second direction (e.g., y-direction). A figure having line segments connecting centers C and C' of the outermost first and second bottom electrodes 120a and 120b may be determined by an arrangement of the first and second bottom electrodes 120a and 120b. For example, when the first and second bottom electrodes 120a and 120b are arranged in the honeycomb structure, the figure composed of segments connecting the adjacent centers C and C' may include a triangular wave form. A triangular wave form may be comprised of a regular repeating pattern of line segments, and the line segments may be arranged at angles relative to one another such that the line segments appear to form sides of adjacent triangles. In other words, high points P and low points P' of the wave form of the first profile pf1a along the second direction (the y-direction) may respectively correspond to high points P and low points P' of the wave form of the figure composed of segments connecting the adjacent centers. In other words, the wave form of the first profile pf1a may be formed to correspond to location changes in centers of the outermost first and second bottom electrodes 120a and 120b. Changes of the first profile pf1a along the second direction may coincide with location changes of centers of the outermost first and second bottom electrodes 120a and 120b along the second direction.

According to an embodiment, the semiconductor memory device 100a may include first bottom electrode arrays Arr1 which include the plurality of first bottom electrodes 120a separated from each other by a first gap d1 along the first direction (the x-direction) on the substrate and separated from each other by a second gap d2 along the second direction (the y-direction) intersecting the first direction (the x-direction). The first gap d1 and the second gap d2 may be distances between the centers of adjacent first bottom electrodes 120a in the x-direction and the y-direction, respectively. In addition, the semiconductor memory device 100a may include second bottom electrode arrays Arr2 which include the plurality of second bottom electrodes 120b separated from each other by a third gap d3 along the first direction (the x-direction) on the substrate and separated from each other by a fourth gap d4 along the second direction (the y-direction). The third gap d3 and the fourth gap d4 may be distances between the centers of adjacent second bottom electrodes 120b in the x-direction and the y-direction, respectively. In this case, the first bottom electrodes 120a and the second bottom electrodes 120b may be misaligned relative to each other with respect to the first direction. In addition, each row and column of the second bottom electrode arrays Arr2 may be located respectively between two adjacent rows and columns of the first bottom electrode arrays Arr1. In some embodiments, the first bottom electrode arrays Arr1 and the second bottom electrode arrays Arr2 may be repeatedly and alternately arranged relative to each other. In certain embodiments, rows and/or columns of the second bottom electrode arrays Arr2 may be arranged such that a space between two adjacent rows and/or columns of the first bottom electrode arrays Arr1 is divided into equal areas. In other embodiments, rows and/or columns of the second bottom electrode arrays Arr2 may be actually located at center points between two adjacent rows and/or columns of the first bottom electrode arrays Arr1. In some embodiments, adjacent columns and rows of the first bottom electrode arrays Arr1 may be substantially parallel to one another in the first and second directions, respectively, and adjacent columns and rows of the second bottom electrode arrays Arr2 may be substantially parallel to one another in the first and second directions, respectively.

The semiconductor memory device 100a may further include the support structure pattern 130a between the first and second bottom electrodes 120a and 120b. In some embodiments, horizontal distances from centers C of the outermost first bottom electrodes 120a to the outermost line of the support structure pattern 130a along the second direction (the y-direction) and horizontal distances from centers C' of the outermost second bottom electrodes 120b to the outermost line of the support structure pattern 130a along the second direction (the y-direction) may be the same. In this case, centers C and C' of the first and second bottom electrodes 120a and 120b may be referred to as centers of the pillar-type bottom electrodes 120 described above in the plan view. Alternatively, the arrangement of the outermost first bottom electrodes 120a and the outermost second bottom electrodes 120b may correspond to the outermost line of the support structure pattern 130a. In some embodiments, the support structure pattern 130a may have a flat, plate-like shape, parallel to and spaced apart from a top surface of the substrate. For example, there may be a distance between the top surface of the substrate and the support structure pattern 130a.

In some embodiments, the first gap d1 and the third gap d3 may be the same length, and the second gap d2 and the fourth gap d4 may be the same length. In this case, an angle in the plan view made by two different first and second bottom electrodes 120a and 120b, which are adjacent to one of the first and second bottom electrodes 120a and 120b as a center, may be a multiple of about 60°. For example, the center of one of the first and second bottom electrodes 120a and 120b may form the vertex of lines extending to the centers of two adjacent first and second bottom electrodes 120a and 120b, which together form about a 60° angle. In this embodiment, the arrangement of the first and second bottom electrodes 120a and 120b may form a honeycomb structure.

When the first and second bottom electrodes 120a and 120b are arranged in a honeycomb structure, the figure composed of segments connecting the centers C and C' of three adjacent first and second bottom electrodes 120a and 120b may include a triangular wave form. In this case, as described above, the outermost line of the support structure pattern 130a may include the wave form, since horizontal distances from centers C of the outermost first bottom electrodes 120a and centers C' of the outermost second bottom electrodes 120b to the outermost line of the support structure pattern 130a along the second direction (the y-direction) are the same. In some embodiments, the outermost line of the support structure pattern 130a may be a perimeter of the support structure pattern 130a, and may be located at the intersection of or border between the edge area EDGE and the block area BLK.

When a first length l1 is defined as a distance from the center C of one of the first bottom electrodes 120a of the honeycomb structure to the center C' of one of the second bottom electrodes 120b, which is at the closest distance from the one of the first bottom electrodes 120a, the length of one segment of the triangular wave may be the first length l1. The length of one segment of the triangular wave may be denoted as a length of a segment PP' connecting a high point P to a low point P' of the triangular wave. Depending on the case, the length of the one segment may be about 3.0 F. Alternatively, a distance along the first direction (the x-direction) from one high point P of the first profile pf1a along the second direction (the y-direction) to another high point P which is closest to and different from the one high point along the second direction (the y-direction) may be about 5.2 F. F may denote a minimum lithographic feature size. A distance between centers of the first and second bottom electrodes 120a and 120b along the second direction (d2 and d4) may be approximately about 2.6 F.

In some embodiments, the distance between centers of the first and second bottom electrodes 120a and 120b along the second direction (the y-direction) may be half of the distance between high points of the first profile pf1a along the second direction. For example, when a 1 F corresponds to about 18 nm per a particular design rule, the length of the one segment of the triangular wave may be about 54 nm (that is, about 3.0 F), the distance between high points of the first profile pf1a along the second direction may be about 93.6 nm (that is, about 5.2 F), and the distance between centers of the first and second bottom electrodes 120a and 120b along the second direction (the y-direction) may be about 46.8 nm. However, the embodiment is not limited thereto. In other words, 1 F may vary depending on the particular design rule. In detail, 1 F may be more than about 18 nm or less than about 18 nm.

Figure 1B:
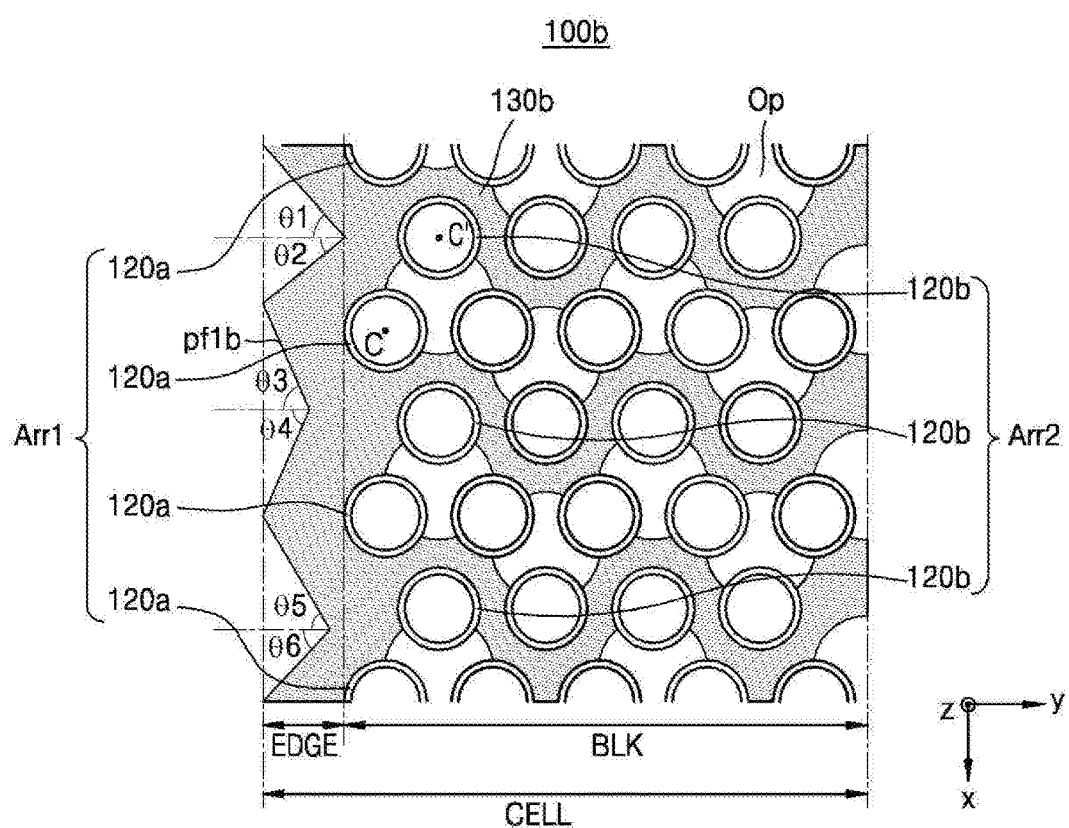
FIG. 1B is a plan view of a semiconductor memory device, according to an example embodiment.

FIG. 1B is a plan view of a semiconductor memory device 100b according to an embodiment.

Hereinafter, only difference from the descriptions provided above with reference to FIG. 1A will be provided for the sake of convenience.

Referring to FIG. 1B, angles $\theta_1$ through $\theta_6$ made by a first profile pf1b, which is a horizontal cross-sectional profile (e.g., a top-down or plan view) of the support structure pattern 130b in the edge area EDGE, with respect to the second direction (the y-direction), may be different from each other. For example, the first profile pf1b may include a wave form of an irregular shape. Alternatively, the first profile pf1b may include a wave form having deviation with respect to a triangular wave, a sine wave, a saw-tooth wave, and a square wave, or various waves formed by a combination of these waves. In other words, the first profile may have a shape distorted from a particular form in which waves are periodically repeated.

Depending on the case, the first and second bottom electrodes 120a and 120b may be arranged in an irregular shape having deviation from a honeycomb structure, and the wave form of the first profile pf1b may be formed to correspond to the irregular shape. For example, horizontal distances from centers C of the outermost first bottom electrodes 120a to the outermost line of the support structure pattern 130b along the second direction (the y-direction) and horizontal distances from centers C' of the outermost second bottom electrodes 120b to the outermost line of the support structure pattern 130b along the second direction (the y-direction) may be the same.

Figure 1C:
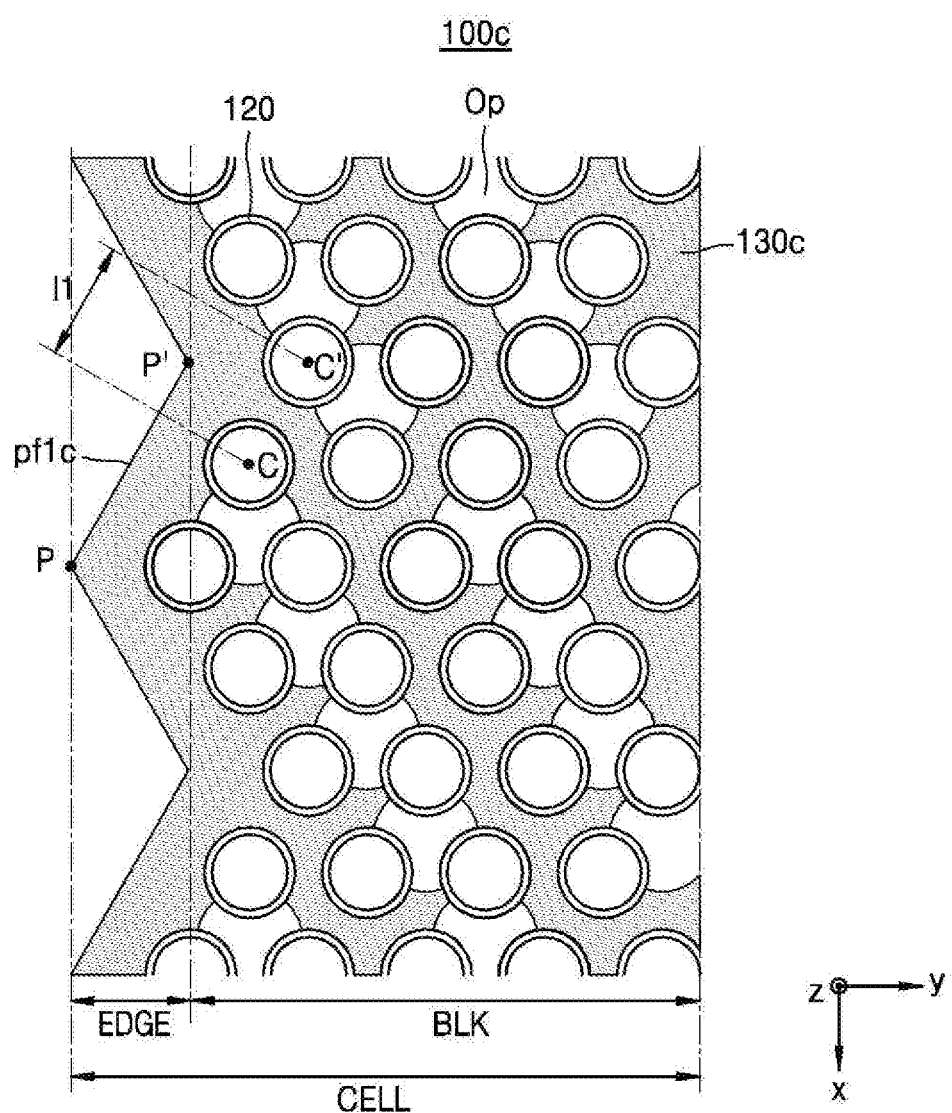
FIG. 1C is a plan view of a semiconductor memory device, according to an example embodiment.

FIG. 1C is a plan view of a semiconductor memory device 100c according to an embodiment.

Hereinafter, only difference from the descriptions provided above with reference to FIG. 1A will be provided for the sake of convenience.

A first profile pf1c, which is a horizontal cross-sectional profile of the support structure pattern 130c in the edge area EDGE, may be a triangular wave. In this case, when the first length l1 in the honeycomb structure is defined as a distance from the center C of one of the first and second bottom electrodes 120a and 120b to the center C' of another one of the first and second bottom electrodes 120a and 120b, which is closest to the one of the first and second bottom electrodes 120a and 120b, the length of one segment of the triangular wave in FIG. 1A may be the same as the first length l1. However, in FIG. 1C, the length of one segment of the triangular wave may be twice the first length l1. However, the embodiment is not limited thereto. For example, the length of the one segment may be three, four, five, etc. times the first length l1, and may be other different lengths.

The distance from centers of the outermost first and second bottom electrodes 120a and 120b to the outermost line of the support structure pattern 130c may be fixed. For example, the first profile pf1c may be formed to correspond to an arrangement of the first and second bottom electrodes 120a and 120b located in the edge area EDGE.

Figure 1D:
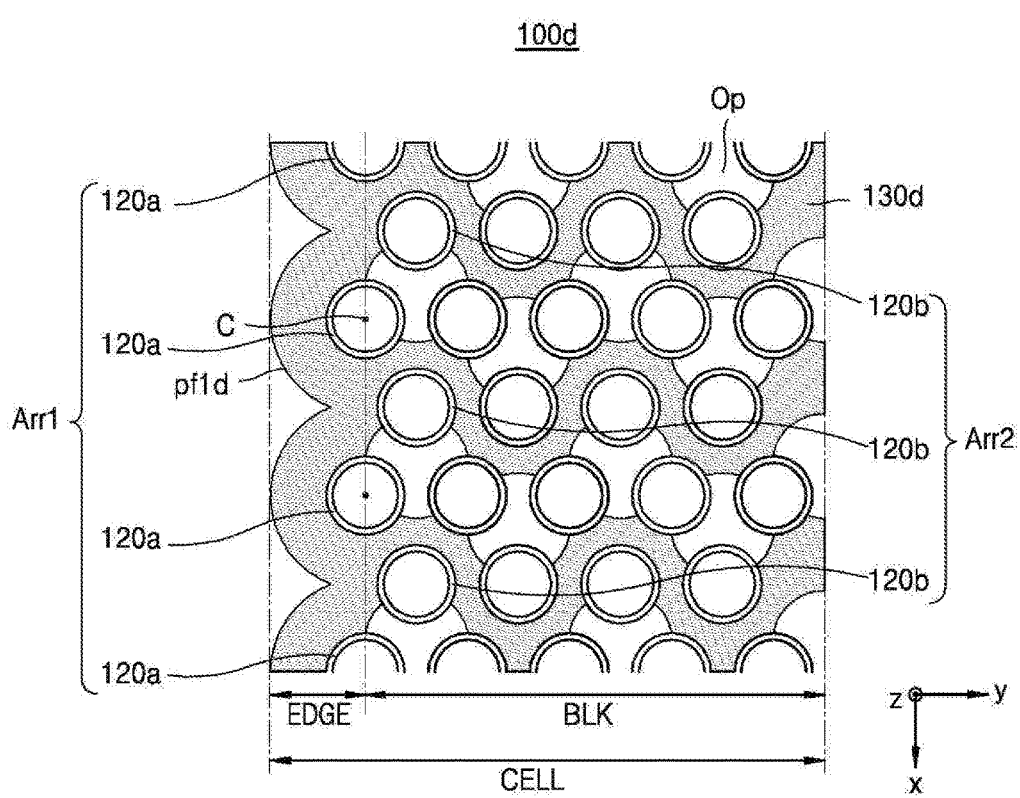
FIG. 1D is a plan view of a semiconductor memory device, according to an example embodiment.

FIG. 1D is a plan view of a semiconductor memory device 100d according to an embodiment.

Hereinafter, only difference from the descriptions provided above with reference to FIG. 1A will be provided for the sake of convenience.

A first profile pf1d, which is a horizontal cross-sectional profile of a support structure pattern 130d in the edge area EDGE, may have a form including a curve (e.g., a scalloped form). In some embodiments, the first profile pf1d may include a wave form in which centers C of the outermost first bottom electrodes 120a are centers of circles, and semi-circles which are convex toward the outside of the cell block area BLK are repeated.

In this case, a diameter of the semi-circle of the first profile pf1d may be the same as a distance between centers C of two adjacent first bottom electrodes 120a.

In the exemplary embodiments, the area of the support structure pattern 130 that is encompassed by the line segments forming the perimeter of each hexagonal pattern (i.e., the line segments extending from the center point of one bottom electrode 120 to the center point of another bottom electrode 120 of the same hexagonal structure) includes at least one open area Op. For example, FIGS. 1A, 1B, and 1D illustrates hexagonal patterns each having two open areas Op, and FIG. 1C illustrates hexagonal patterns each having only one open area Op.

FIGS. 2A through 2F are cross-sectional views of semiconductor memory devices 200a through 200f according to example embodiments.

Hereinafter, only difference from the descriptions provided above with reference to FIG. 1A will be provided for the sake of convenience.

The support structure pattern 130a may be formed in a one-body type including a large number of open areas Op, as illustrated in FIG. 1A. For example, the entire structure of the support structure pattern 130a may be connected.

Figure 2A:
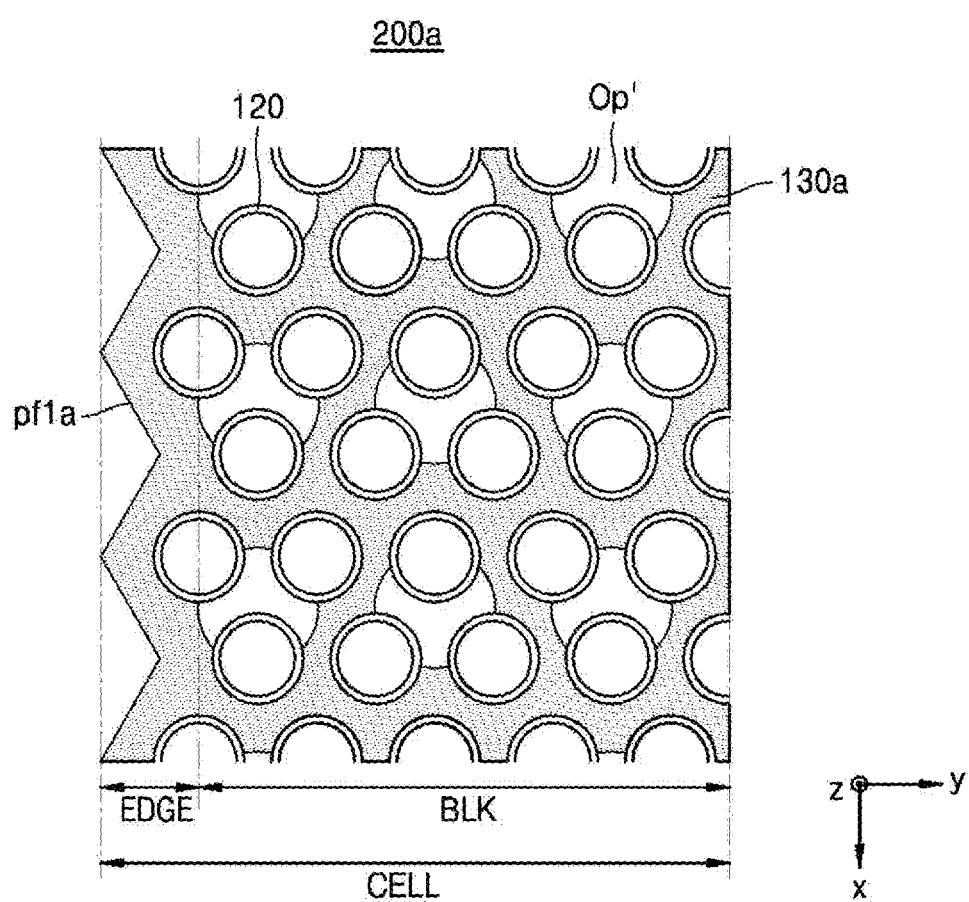
FIG. 2A is a plan view of a semiconductor memory device, according to an example embodiment.

The open area Op may have various forms. In some embodiments, the open area Op may have a shape that exposes groups of adjacent first and second bottom electrodes 120a and 120b. Referring to FIG. 2A, for example, an open area Op' may have a circular shape exposing three of the first and second bottom electrodes 120a and 120b, and may be arranged without misalignment along the first direction (the x-direction) and the second direction (the y-direction), unlike the arrangement with a misaligned structure in FIG. 1A. In the embodiment of FIG. 2A, the open areas Op' may be arranged in an aligned array in the first and second directions.

Figure 2B:
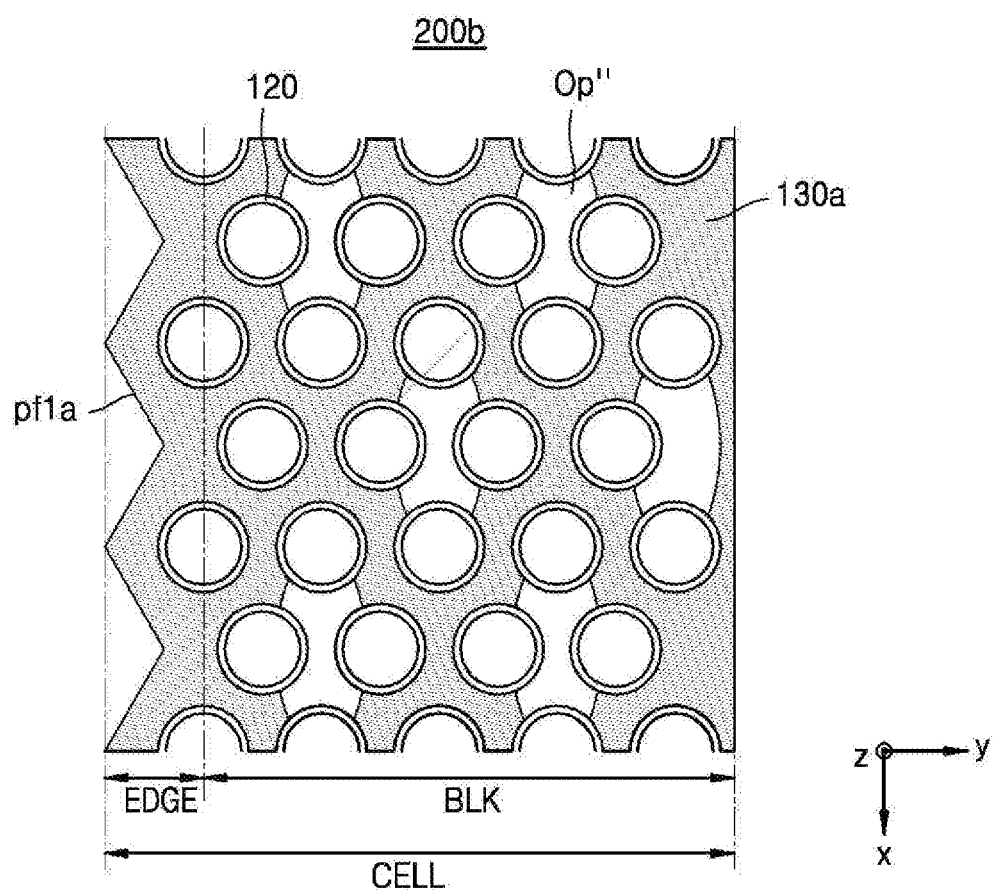
FIG. 2B is a plan view of a semiconductor memory device, according to an example embodiment.

Alternatively, referring to FIG. 2B, an open area Op" may include an elliptical shape exposing four of the first and second bottom electrodes 120a and 120b, and may be misaligned relative to each other along the second direction. The open area Op" may be arranged, along the first direction (the x-direction) in parallel with the top surface of the substrate 110 and along the second direction (the y-direction) intersecting the first direction (the x-direction), to form large numbers of rows and columns. The open areas Op" on any one row may be misaligned relative to the open areas Op" on another adjacent row. In other words, the x-coordinates of open areas Op" on any one row and that of the open areas Op" on another adjacent row second direction (the y-direction) may be different from each other. However, the embodiment is not limited thereto. For example, the open areas Op" may be arranged without misalignment.

Depending on the case, the open areas Op" may not expose the bottom electrodes 120 on the outermost perimeters (e.g., edge area EDGE), as illustrated in FIG. 2B. The reason is that the bottom electrodes 120 on the outermost perimeters may be dummy bottom electrodes and may not actually store information. However, the embodiment is not limited thereto. Although not illustrated, in some embodiments, the open areas Op" may expose all of the bottom electrodes 120. This feature may be equally applicable to open areas Op"" in FIG. 2E and open areas Op"" in FIG. 2F also, as described later.

Figure 2C:
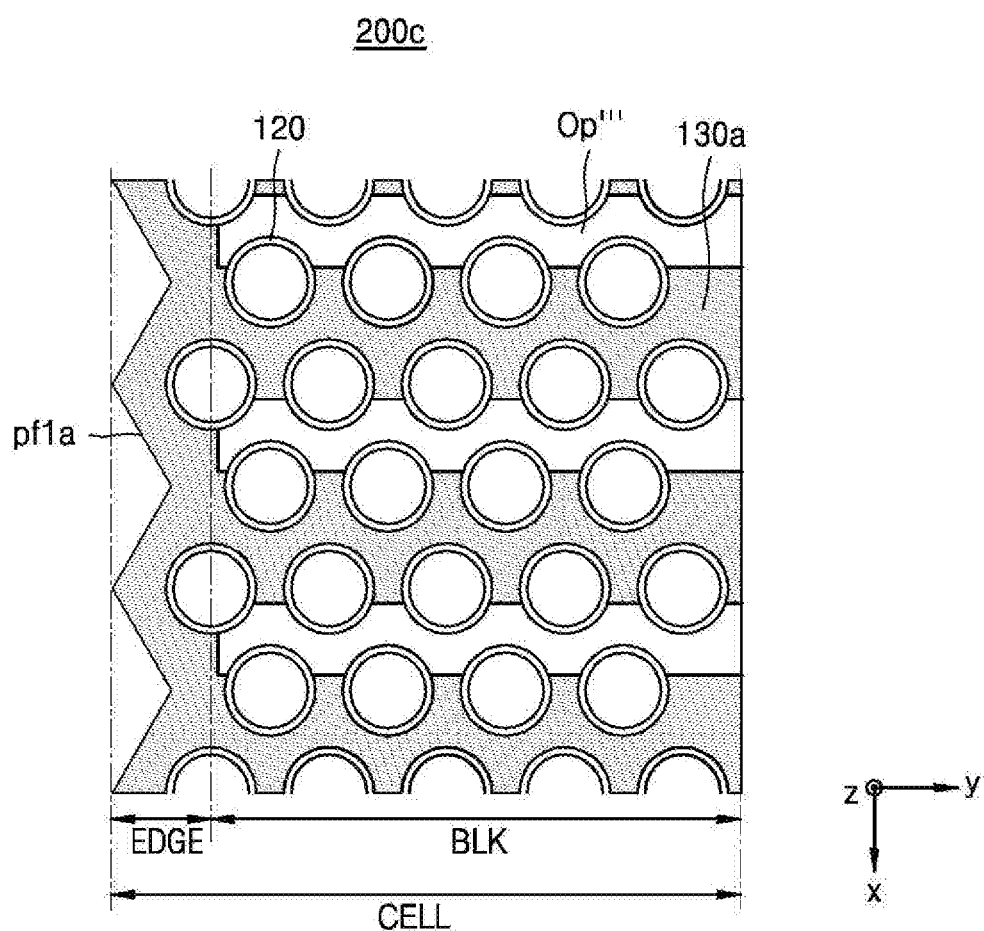
FIG. 2C is a plan view of a semiconductor memory device, according to an example embodiment.

Referring to FIG. 2C, an open area Op'" may have a rectangular shape exposing a plurality of the bottom electrodes 120 and may be arranged according to a particular rule. In some embodiments, the open area Op'" may be arranged without misalignment in the first and/or second directions (x- and/or y-directions). In other embodiments, the open areas Op'" on any one row may be misaligned relative to the open areas Op'" on one or more adjacent rows. In other words, the y-coordinates of the open areas Op'" on any one row and that of the open areas Op'" on one or more adjacent rows may be different from each other. For example, the beginning and ending y-coordinates of the open areas Op'" may be offset from one another. However, the embodiment is not limited thereto.

Figure 2D:
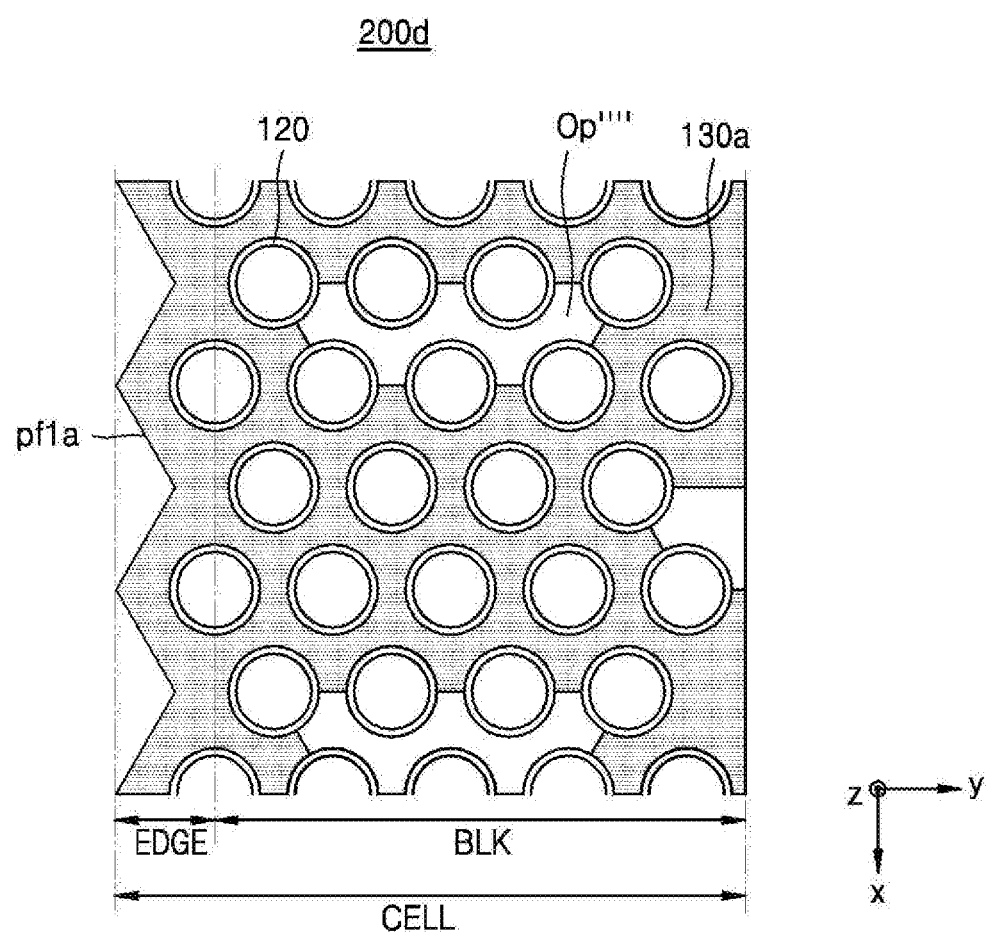
FIG. 2D is a plan view of a semiconductor memory device, according to an example embodiment.

Referring to FIG. 2D, an open area Op"" may have a trapezoidal shape. Two parallel sides of the trapezoidal shape may extend along the second direction (the y-direction). As illustrated in FIG. 2D, a top side of the trapezoid of the open area Op"" exposes four of the bottom electrodes 120 and a bottom side exposes three of the bottom electrodes 120. However, the embodiment is not limited thereto. In detail, the top side of the trapezoid of the open area Op"" may expose two, three, five or more of the bottom electrodes 120. In addition, the bottom side of the trapezoid of the open area Op"" may expose two, four, five or more of the bottom electrodes 120. The open areas Op"" on any one row may be misaligned relative to the open areas Op"" on another adjacent row. In other words, the x-coordinate of the open areas Op"" on any one row and that of the open areas Op"" on another adjacent row may be different from each other. In some embodiments, there may be no overlap between adjacent open areas Op"" in the x-direction.

The open areas Op"" are illustrated to expose a portion of the bottom electrodes 120 with which each open area Op"" intersects. However, the embodiment is not limited thereto. For example, each open areas Op"" may expose the whole bottom electrodes 120 with which that open area Op"" intersects. In addition, the open areas Op"" may not be misaligned relative to each other on the figure. Also, shapes of trapezoids of the open areas Op"" different from each other may further be different from each other. For example, a portion of the open areas Op"" may include trapezoids with longer top sides, while the remaining portion may include trapezoids with longer bottom sides.

The top side and the bottom side are referred to as two parallel sides of a trapezoid, wherein one of parallel sides located relatively along the second direction (the x-direction) is referred to as the bottom side and the other of parallel sides is referred to as the top side. This is only for the sake of convenience and the shape or the scope of the open area Op"" is not limited. For example, in some embodiments, the top and bottom sides in the second direction (x-direction) may be parallel to one another and the two opposite sides in the first direction (y-direction) may be parallel to one another, thereby forming a parallelogram.

Figure 2E:
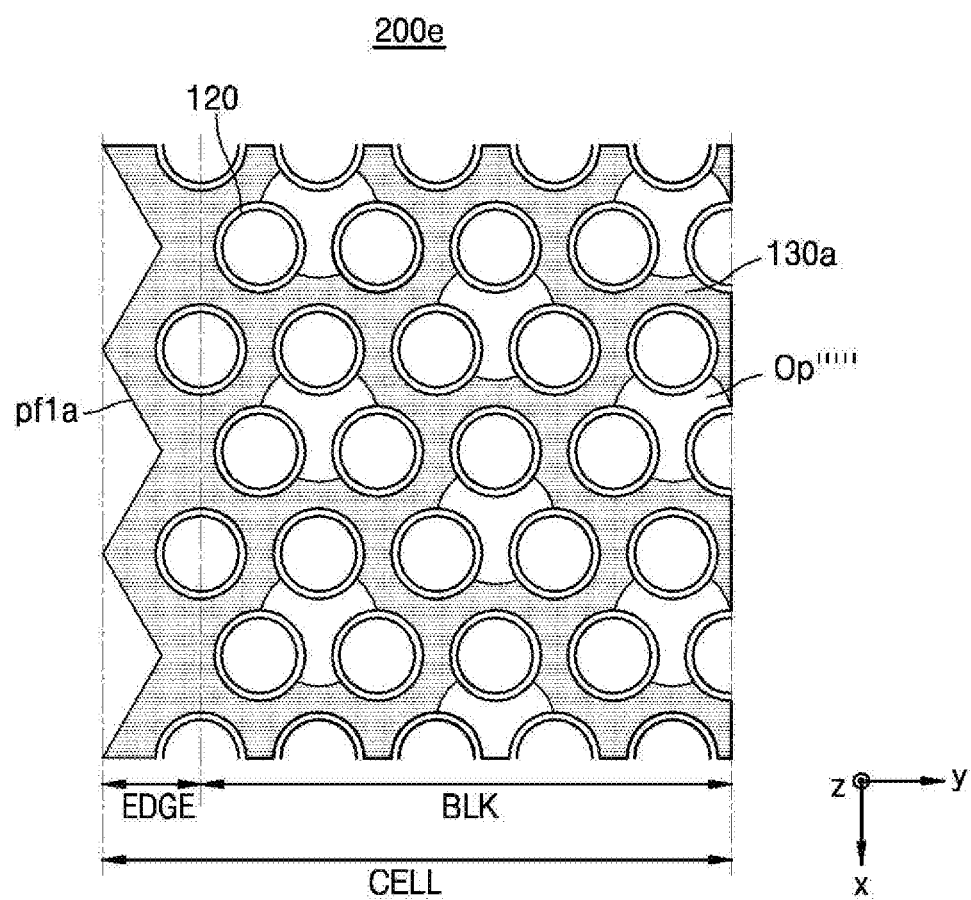
FIG. 2E is a plan view of a semiconductor memory device, according to an example embodiment.

Referring to FIG. 2E, an open area Op""' may have a circular shape exposing three bottom electrodes 120 and be arranged according to a particular rule. According to an embodiment, the open area Op""' may be arranged in a honeycomb structure to be described below. In some embodiments, a center of the open area Op""' may be arranged at a center of a triangle formed by centers of three bottom electrodes 120 which are adjacent to but misaligned relative to each other. For example, a triangle may be formed by connecting the centers of the three bottom electrodes 120 that are exposed by the open area Op""', and the center of the open area Op""' may be the same as the center of the triangle. When F is defined as the minimum lithographic feature size, a distance between centers of the bottom electrodes 120 along the second direction (the y-direction) may be approximately about 2.6 F and a distance between centers of the open areas Op""' along the second direction (the y-direction) may be approximately about 5.2 F.

Figure 2F:
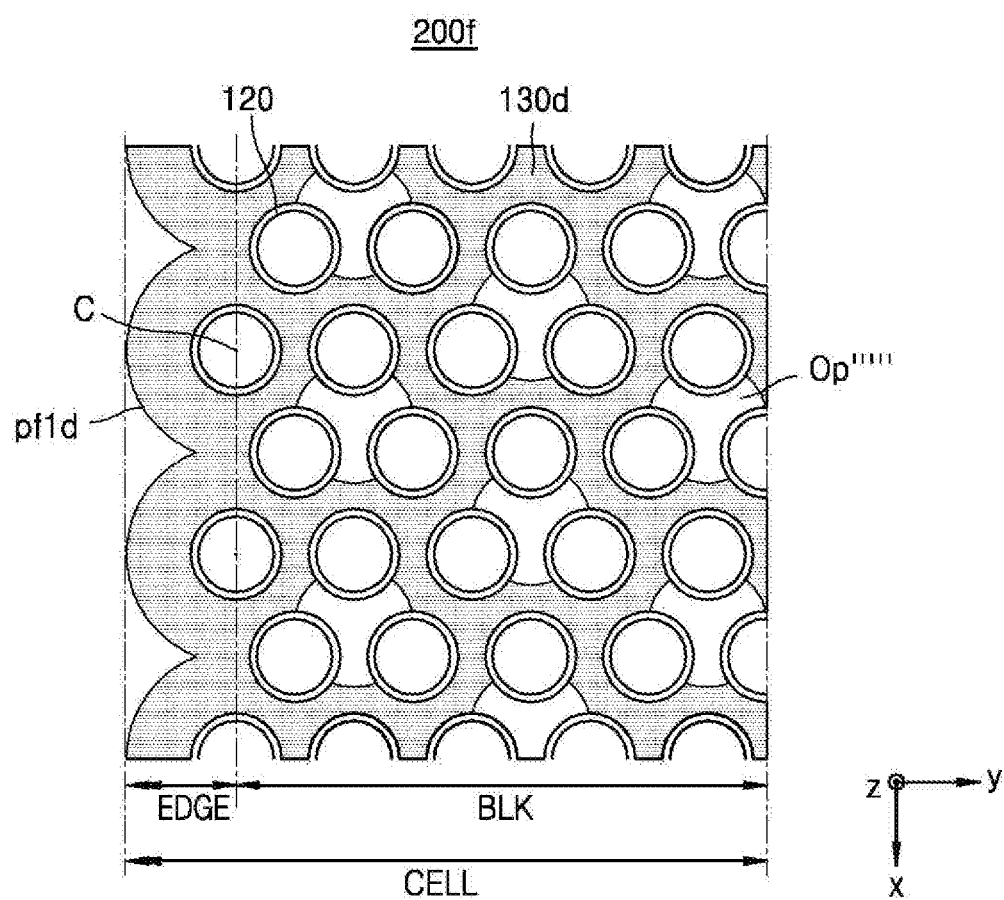
FIG. 2F is a plan view of a semiconductor memory device, according to an example embodiment.

The open area Op""' in FIG. 2F, similar to that in FIG. 2E, may have a circular shape exposing three bottom electrodes 120 and may be arranged in a honeycomb structure to be described below. In addition, the first profile pf1$d$, which is the horizontal cross-sectional profile of the support structure pattern 130$d$ in the edge area EDGE, may have a shape wherein waves of a half circular shape are repeated with respective centers of the bottom electrodes 120 on the outermost perimeter as a center of the half circle, similar to the description with reference to FIG. 1D.

The open areas Op, Op', Op'", and Op""' are illustrated to expose all of the bottom electrodes 120 in FIGS. 1A-1D, 2A, 2C, 2E and 2F, respectively. However, the embodiment is not limited thereto. In some embodiments, a number of the bottom electrodes 120 may not be exposed in whole or in part, as shown by Op" and Op"" in FIGS. 2B and 2D. For example, the bottom electrodes 120 close to the edge area EDGE may not be exposed.

Shapes and arrangements of the open areas Op, Op', Op", Or, Op"" and Op""' may vary, as described above. However, the horizontal cross-sectional profiles of the support structure pattern 130$a$ in the edge area EDGE may include wave forms regardless of shapes of the open areas Op, Op', Op", Or, Op"", and Op""'.

Figure 3A:
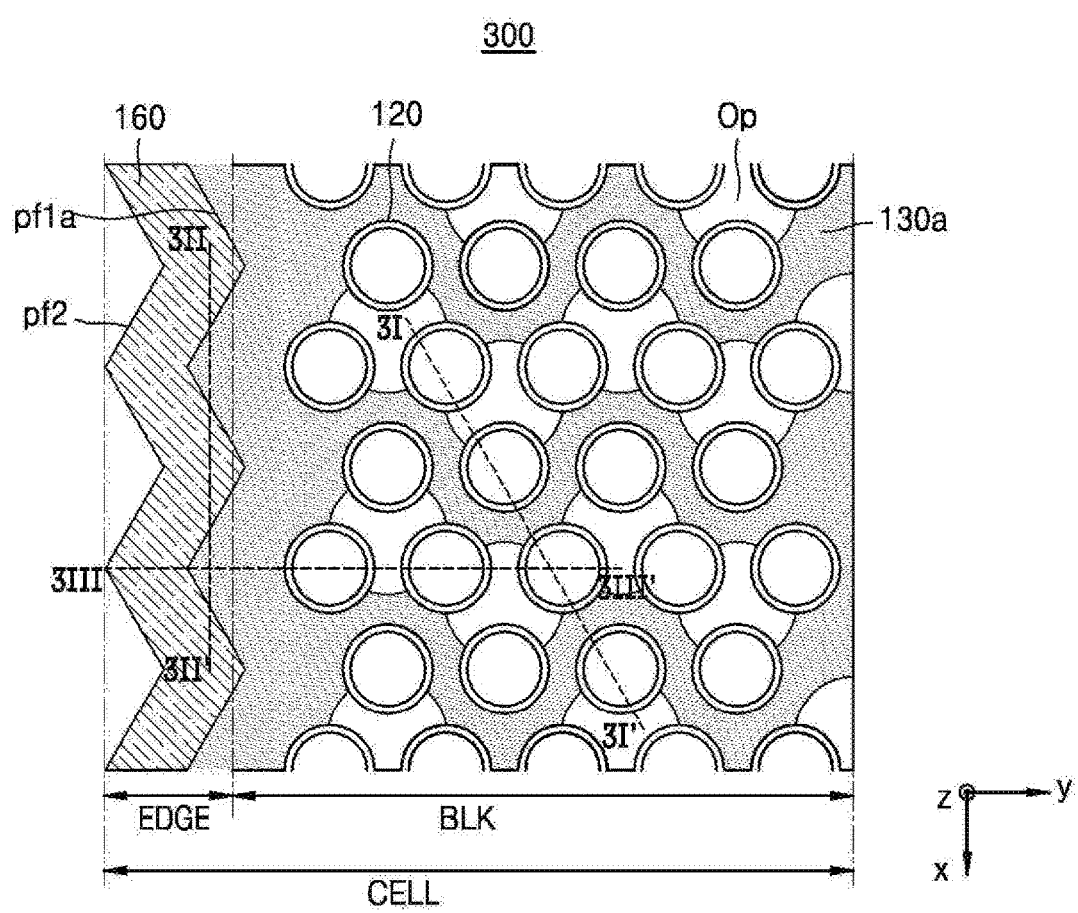
FIG. 3A is a plan view of a semiconductor memory device, according to an example embodiment.
Figure 3B:
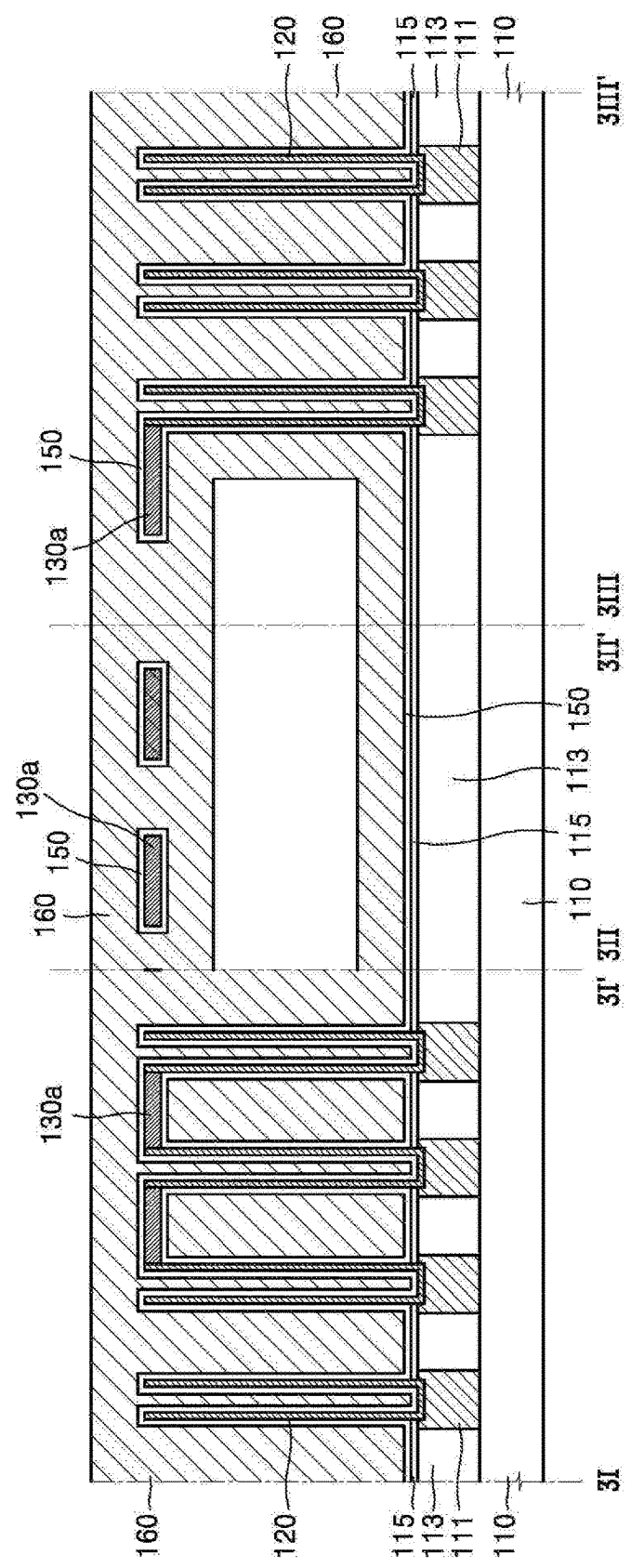
FIG. 3B is a cross-sectional view of a semiconductor memory device, according to an example embodiment.

FIG. 3A is a plan view of a semiconductor memory device 300 according to an embodiment. FIG. 3B illustrates cross-sectional views of FIG. 3A, cut along lines 3I-3I', 3II-3II' and 3III-3III'.

Below, differences from descriptions provided above with reference to FIG. 1A will be provided for the sake of convenience. In FIG. 3A, the bottom electrodes 120 and the support structure pattern 130$a$ may be covered by a top electrode 160 and may not be exposed. However, for the sake of convenience, in FIG. 3A, the bottom electrode 120 and the support structure pattern 130$a$ are illustrated in the cell block area BLK with a portion of the support structure pattern 130$a$ shown in the edge area EDGE, and the top electrode 160 is illustrated in the edge area EDGE with a portion of the top electrode 160 shown in the cell block area BLK.

Referring to FIGS. 3A and 3B, the semiconductor memory device 300 may include a conductive layer 150 formed conformally on the support structure pattern 130a and the bottom electrode 120, and the top electrode 160 formed on the conductive layer 150. The top electrode 160 may be formed to cover all external sides of the conductive layer 150. Referring to FIG. 3B, a contact plug 111 may be formed in the interlayer insulating layer 113 on the substrate 110, an etching prevention layer 115 may be formed on the contact plug 111 and the interlayer insulating layer 113, and the conductive layer 150 may be formed to extend on a top surface of the etching prevention layer 115.

The first profile pf1a, which is a horizontal cross-section profile of the support structure pattern 130a in the edge area EDGE, may include a wave shape. In addition, a second profile pf2, which is a horizontal cross-section profile of the top electrode 160 in the edge area EDGE, may include a wave shape. In detail, the second profile pf2 may include a triangular wave, a sine wave, a saw-tooth wave, a square wave, a semicircle wave, or various shapes composed of a combination of these waves.

According to an embodiment, the second profile pf2 may be formed along the first profile pf1a, and the second profile pf2 may have a same shape as that of the first profile pf1a. Accordingly, concavo-convex shapes of the first profile pf1a and the second profile pf2 may correspond to each other. In detail, maximum values in a +y direction of the first profile pf1a and the second profile pf2 on the figure, that is, x-coordinate values of points of the first and second profiles pf1a and pf2 closest to the cell block area BLK, may be the same. Reversely, minimum values in a +y direction of the first profile pf1a and the second profile pf2 on the figure, that is, x-coordinate values of points of the first and second profiles pf1a and pf2 closest to the cell block area BLK, may be actually the same.

Figure 4:
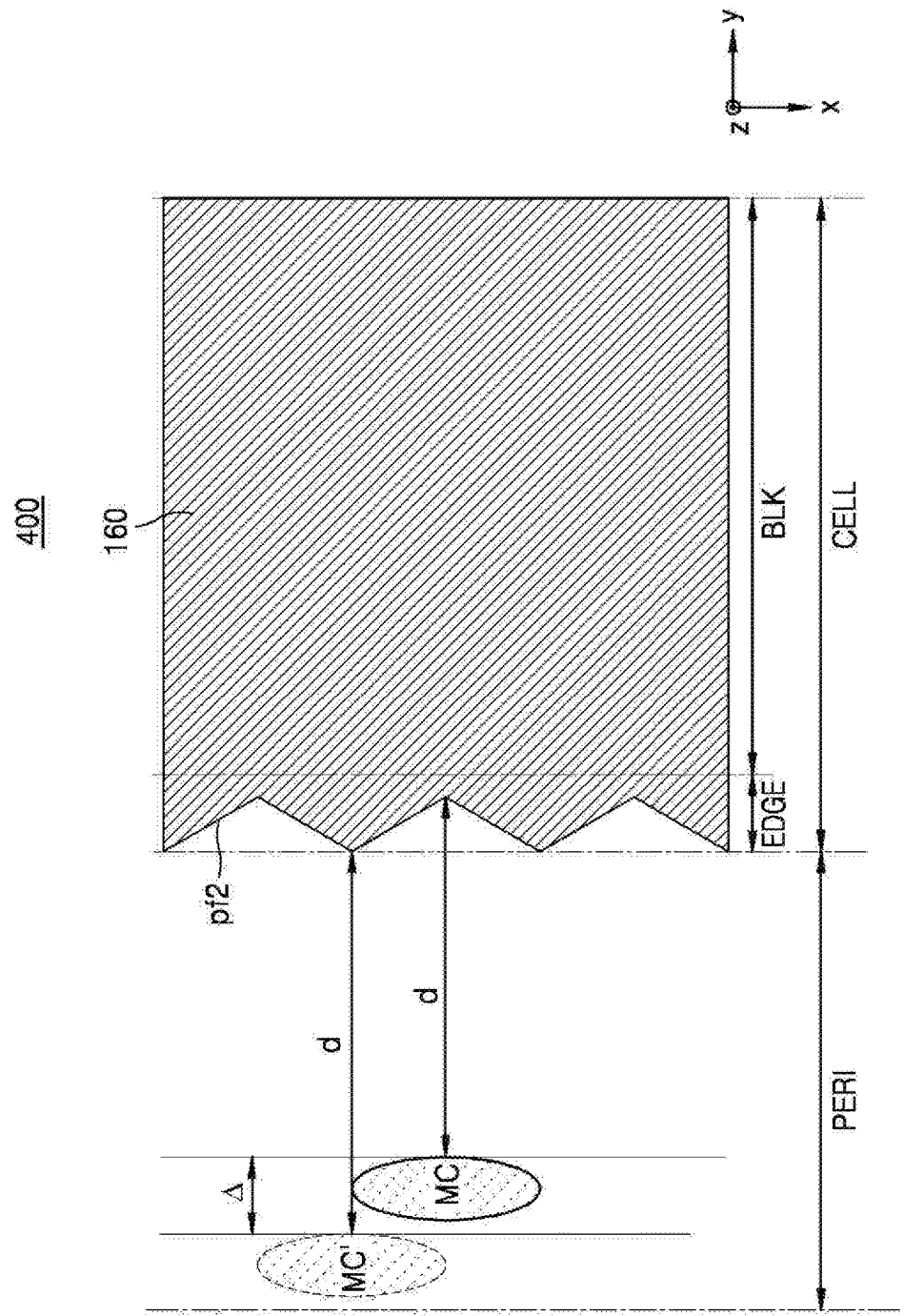
FIG. 4 is a plan view of a semiconductor memory device, according to an example embodiment.

FIG. 4 is a plan view of a semiconductor memory device 400 with respect to which effects of the present concepts according to an embodiment are explained.

Below, differences from descriptions provided above with reference to FIG. 1A will be provided for the sake of convenience.

According to some embodiments the first profile pf1a includes a plurality of first vertices disposed adjacent to the cell block area BLK and a plurality of second vertices spaced farther from the cell block area BLK than the plurality of first vertices. The first and second vertices may correspond to peaks of a triangle wave of the first profile pf1a, but are not limited thereto. According to some embodiments the second profile pf2 includes a plurality of third vertices disposed adjacent to the cell block area BLK and a plurality of fourth vertices spaced farther from the cell block area than the plurality of third vertices. The third and fourth vertices may correspond to peaks of a triangle wave of the second profile pf2, but are not limited thereto. The third vertices may be aligned with the first vertices and the fourth vertices may be aligned with the second vertices but are not limited thereto.

Referring to FIG. 4, the semiconductor memory device 400 may include a substrate with the cell area CELL and a peripheral circuit area PERI defined thereon. The semiconductor memory device 400 may further include a plurality of bottom electrodes (not illustrated) arranged on the cell area CELL along the first direction (the x-direction) and the second direction (the y-direction) intersecting the first direction (the x-direction). Additionally, the semiconductor memory device 400 may include a support structure pattern (not illustrated) in a flat plate shape which connects the bottom electrodes (not illustrated) to each other, supports the bottom electrodes (not illustrated) in the cell area CELL, and includes a plurality of open areas. The semiconductor memory device 400 may include a conductive layer (not illustrated) formed conformally on the bottom electrodes and the support structure pattern, and the top electrode 160 formed on the conductive layer (not illustrated).

The first profile pf1a (not illustrated), which is the horizontal cross-section profile of the support structure pattern (not illustrated) in the edge area EDGE, may include a wave shape. The second profile pf2, which is the horizontal cross-section profile of the top electrode 160 in the edge area EDGE, may be formed along the first profile pf1a. For example, the second profile pf2 may include a wave shape that corresponds to the wave shape of the first profile pf1a. Further, wave shapes of the first profile pf1a and the second profile pf2 may include triangular wave shapes. As described above, the first profile pf1a (not illustrated) may partially include a wave shape, and the second profile pf2 may be formed along the first profile (not illustrated) to also partially include the wave shape. For example, portions in which the metal MC is not formed may partially include the first profile pf1a and/or the second profile pf2 having line shapes, not wave shapes. The first profile pf1a may partially include a wave shape such that a portion concave in a direction of the cell block area BLK of the top electrode 160 corresponds to a location on which the conductive contact MC is arranged. The second profile pf2 may partially include a wave shape such that a portion concave in a direction away from the cell block area BLK of the top electrode 160 corresponds to a location on which the conductive contact MC' is arranged.

Conductive contacts MC and MC' may be formed for a transistor, etc. in the peripheral circuit area PERI. In this case, the top electrode 160 may be separate from the conductive contacts MC and MC' by a certain distance d or more to prevent a short or leakage current between the conductive contacts MC and MC' and the top electrode 160. For example, a value of the certain distance d may be equal to or more than about 245 nm. When the distance d from the top electrode 160 to a conductive contact is less than about 245 nm, a short, etc. may easily occur due to procedural errors. When the distance d from the top electrode 160 to the conductive contacts MC and MC' is too long, the gross number of dies obtainable from one wafer may decrease and production cost may increase.

In the disclosed embodiments, since the second profile pf2 is formed in the wave shape, the contact MC may be formed closer to the cell block area BLK by a differential distance Δ along the second direction (the y-direction) while the certain distance d is maintained, as compared to a location of the contact MC' when the top electrode 160 has a rectangular shape in the cell block area BLK. The differential distance Δ may denote a difference between a maximum distance between contact MC and top electrode 160 in a second direction (y-direction) and a minimum distance between contact MC and top electrode 160 in the second direction (y-direction) of the wave shape. For example, the contact MC may be arranged to correspond to a portion concave along a direction of the cell block area BLK of the top electrode 160 in the edge area EDGE, that is, along the y-direction in the figure. Accordingly, the size of the die may be decreased by a length corresponding to the differential distance Δ with respect to the edge area EDGE, which corresponds to four directions surrounding the cell block area BLK (that is, ±x-directions and ±y-directions), and the gross number of dies obtainable from one wafer may increase. Conversely, when a die with a same size is provided, and the contact MC is arranged to correspond to the concave portions along the cell block area BLK of the top electrode 160, that is, along the y-direction in the figure, the top electrode 160 and the conductive contact MC may be more separated from each other by the differential distance Δ, and short and leakage current may be effectively prevented. In some embodiments, differential distance Δ may be about 1.5 F in the honeycomb structure described above wherein the distance between centers of adjacent bottom electrodes 120 is about 3 F. 1.5 F may denote about 27 nm according to the design rule of about 18 nm described above. However, the embodiment is not limited thereto.

Figure 5:
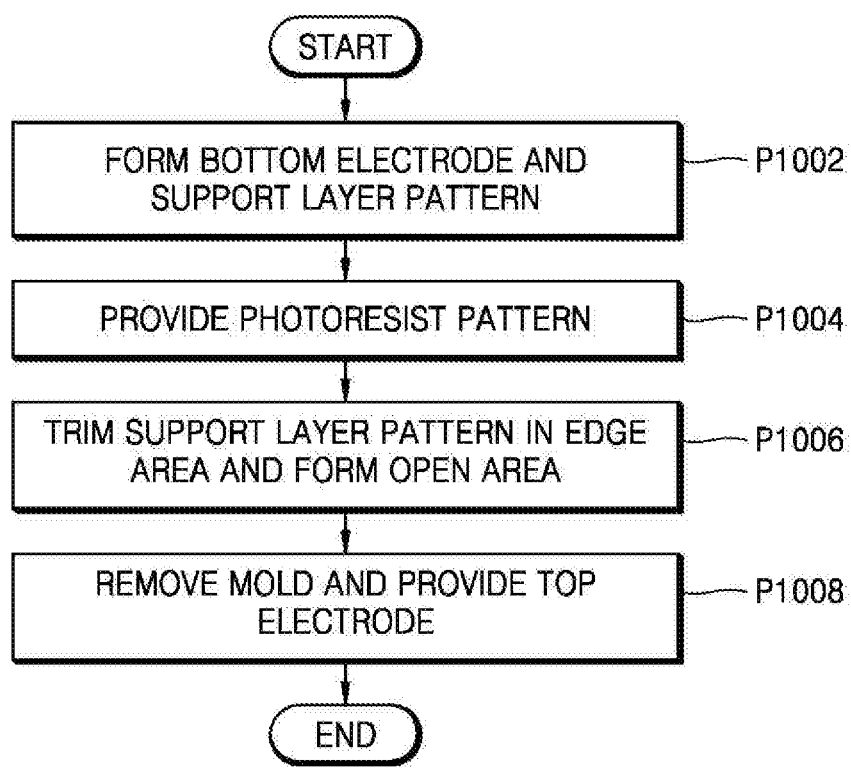
FIG. 5 is a flowchart of a forming process of a semiconductor memory device, according to an example embodiment.

FIG. 5 is a flowchart of a forming process of a semiconductor memory device according to an embodiment.

FIGS. 6A, 7A, 8A, 9A, 10A and 11 are plan views illustrating forming processes of a semiconductor memory device according to an embodiment.

Figure 6A:
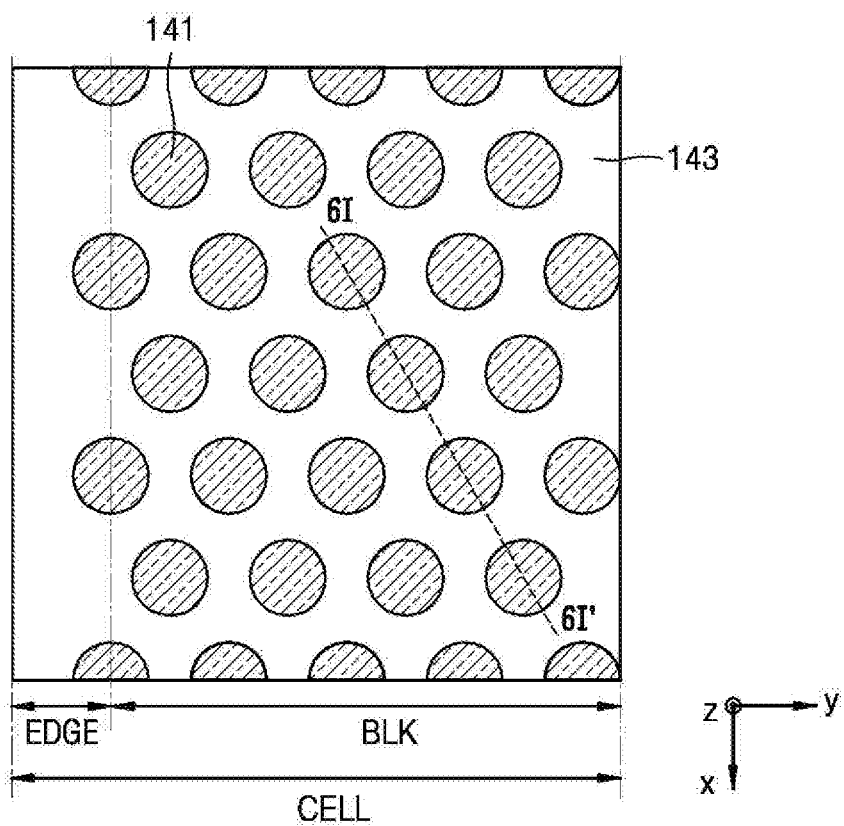
FIG. 6A is a plan view illustrating a forming process of a semiconductor memory device, according to an example embodiment.
Figure 6B:
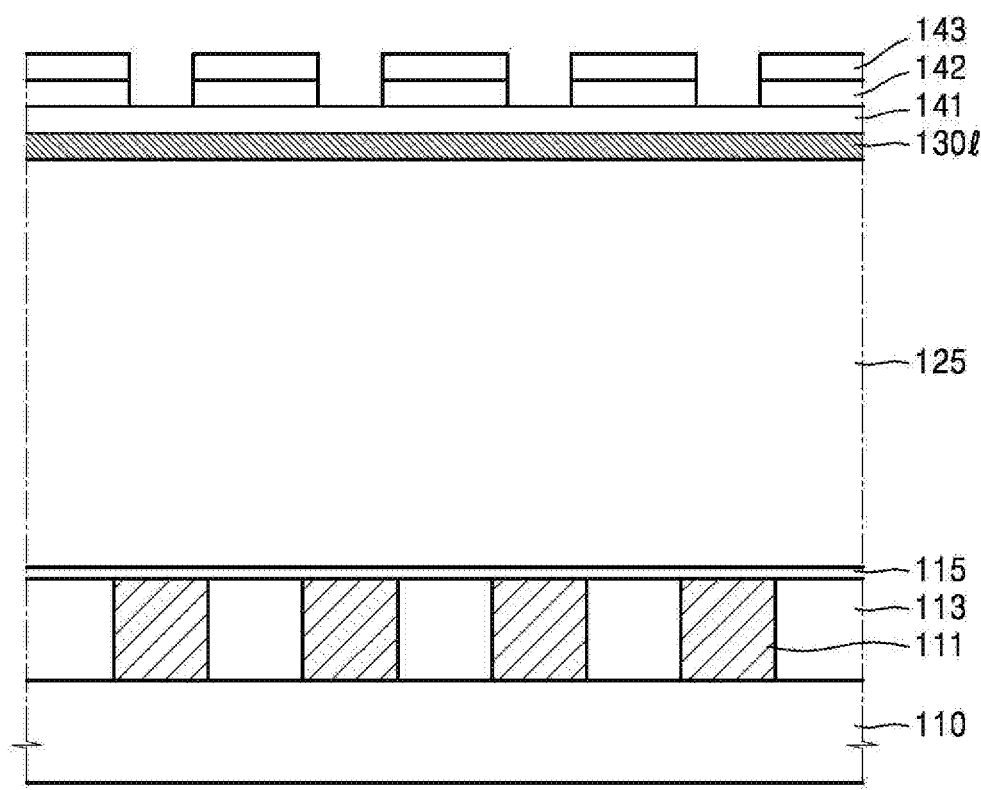
FIG. 6B is a cross-sectional view illustrating a forming process of a semiconductor memory device, according to an example embodiment.
Figure 7A:
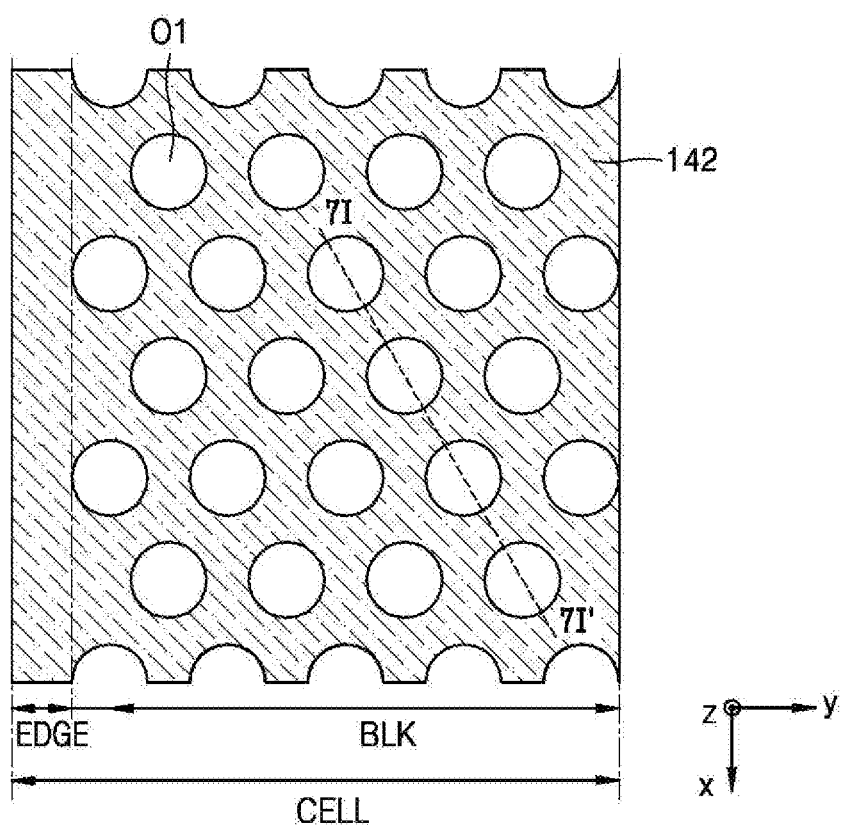
FIG. 7A is a plan view illustrating a forming process of a semiconductor memory device, according to an example embodiment.
Figure 7B:
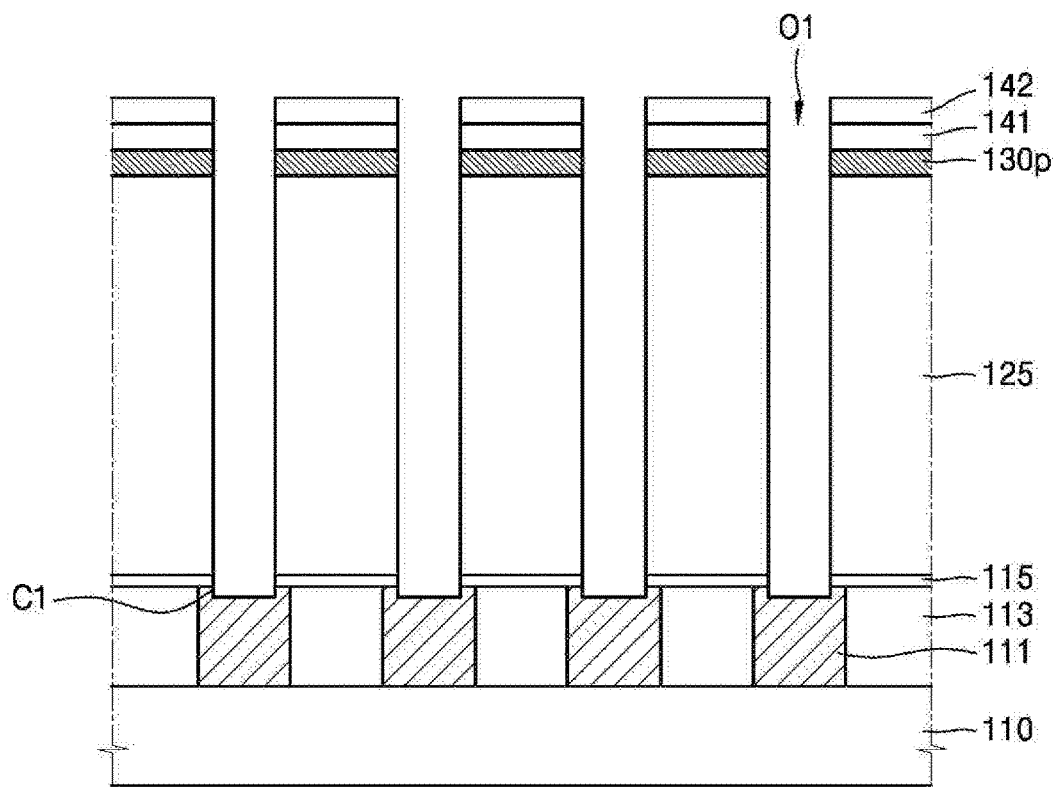
FIG. 7B is a cross-sectional view illustrating a forming process of a semiconductor memory device, according to an example embodiment.
Figure 8A:
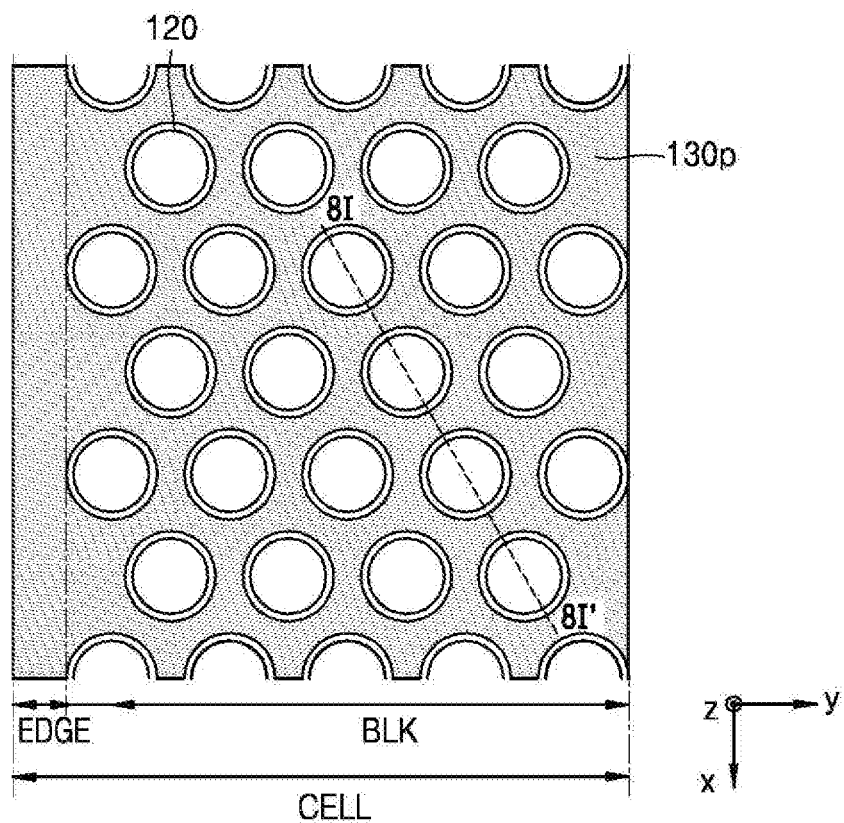
FIG. 8A is a plan view illustrating a forming process of a semiconductor memory device, according to an example embodiment.
Figure 8B:
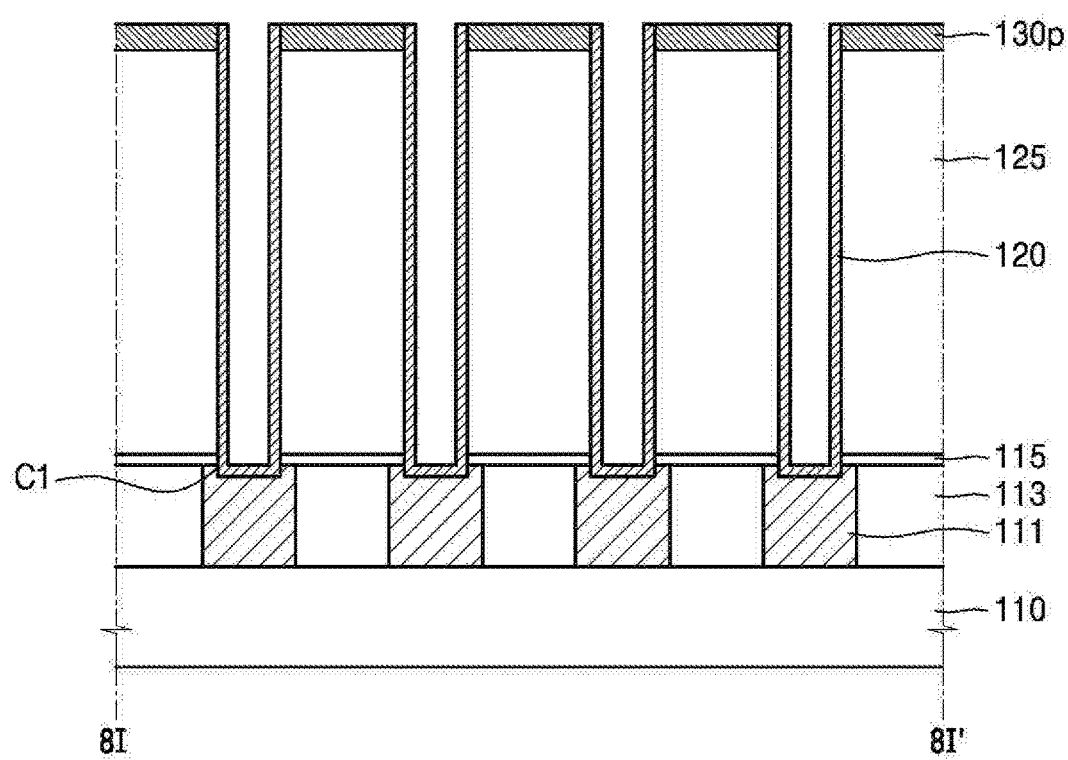
FIG. 8B is a cross-sectional view illustrating a forming process of a semiconductor memory device, according to an example embodiment.
Figure 9A:
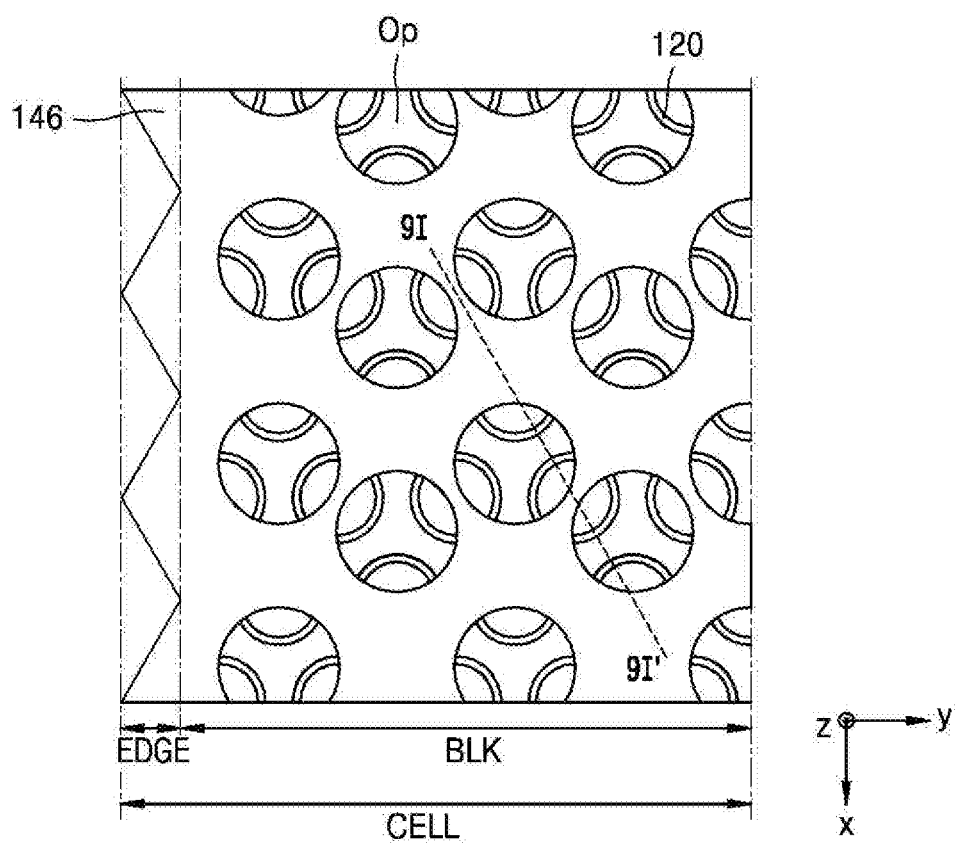
FIG. 9A is a plan view illustrating a forming process of a semiconductor memory device, according to an example embodiment.
Figure 9B:
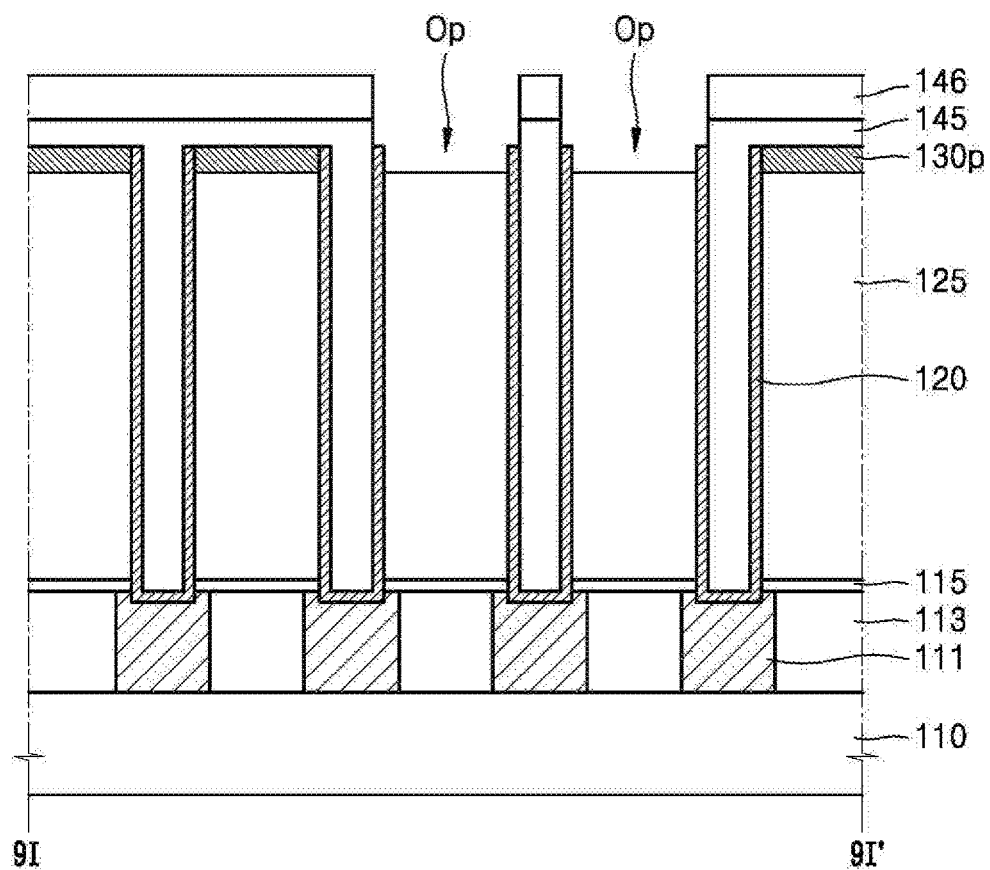
FIG. 9B is a cross-sectional view illustrating a forming process of a semiconductor memory device, according to an example embodiment.
Figure 10A:
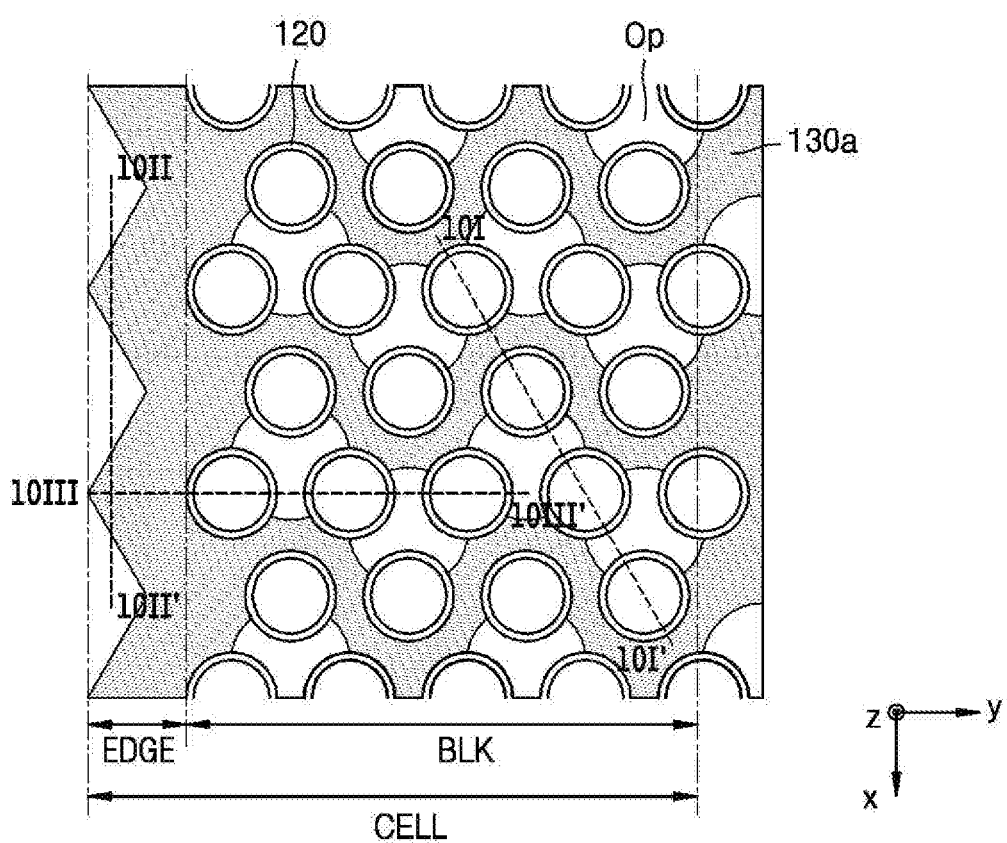
FIG. 10A is a plan view illustrating a forming process of a semiconductor memory device, according to an example embodiment.

FIGS. 6B, 7B, 8B, 9B and 10B are, respectively, cross-sectional views of FIG. 6A cut along the line 6I-6I', FIG. 7A cut along the line 7I-7I', FIG. 8A cut along the line 8I-8I', FIG. 9A cut along the line 9I-9I', and FIG. 10A cut along lines 10I-10I', 10I-10I'', and 10III-10III'.

Referring to FIGS. 5, 6A and 6B, in operation P1002, a contact plug 111 may be formed in the interlayer insulating layer 113 on the substrate 110, an etching prevention layer 115 may be formed on the contact plug 111, and a mold layer 125 may be formed on the etching prevention layer 115. The mold layer 125 may include an oxide layer. For example, the mold layer 125 may include oxide layers such as borophosphosilicate glass (BPSG), spin on dielectric (SOD), phosphosilicate glass (PSG), low pressure tetra ethyl ortho silicate (LP-TEOS), or plasma enhanced tetra ethyl ortho silicate (PE-TEOS). A thickness of the mold layer 125 may be approximately about 500 nm to about 4000 nm. However, the embodiment is not limited thereto.

Afterwards, a support layer 130*l* may be formed on the mold layer 125. The support layer 130*l* may be a material to prevent a collapse of the bottom electrode 120 in a subsequent wet etching process and may be formed by a nitride layer. A thickness of the support layer 130*l* may be about 20 nm to about 150 nm and may be formed by not only the nitride layer but also an un-doped polysilicon layer. However, the embodiment is not limited thereto.

Afterwards, a first sacrificial layer 141 may be formed on the support layer 130*l*. In this case, the first sacrificial layer 141 may include oxide layers such as LP-TEOS, tetra ethyl ortho silicate (TEOS), BPSG, PSG, un-doped silicate glass (USG), SOD, and high density plasma oxide (HDP). A thickness of the first sacrificial layer 141 may be about 50 nm to about 200 nm.

Afterwards, photoresist may be doped on the first sacrificial layer 141 and patterned via exposing and developing to form a photoresist pattern 143. At this point, an open area, in which a bottom electrode is to be formed, may be defined by the photoresist pattern 143. Prior to forming the photoresist pattern 143, a hard mask layer 142 including amorphous carbon, a polysilicon layer, etc. may have been formed in advance, and an anti-reflective coating (not illustrated) may be formed on the hard mask layer 142. Afterwards, the hard mask layer 142 may be etched by using the photoresist pattern 143 as an etching mask.

Referring to FIGS. 5, 7A and 7B, after the photoresist pattern 143 has been removed in operation P1002, the first sacrificial layer 141, the support layer 130*l*, the mold layer 125, and the etching prevention layer 115 may be etched by using the hard mask layer 142 as the etching mask, as in operation P1004. Accordingly, a plurality of open holes O1 may be formed and a top surface of the contact plug 111 may be exposed via the open hole O1. The support layer 130*l* may become a support layer pattern 130*p* via etching.

When the mold layer 125 is dry etched, a side wall of the open hole O1 may have a slope of about 89° to about 89.9°. Accordingly, the open hole O1 may have a shape wherein a bottom center diameter (CD) is smaller than a top CD. The open hole O1 is illustrated to have a vertical shape for the sake of convenience. In addition, a hole C1 may be formed on a top surface of the contact plug 111 via an excessive etching. Alternatively, the hole C1 may not be formed on the top surface of the contact plug 111 to extend into an interior of the contact plug 111.

Referring to FIGS. 5, 8A and 8B, after the hard mask layer 142 has been removed in operation P1002, a conductive layer to function as the bottom electrode may be deposited onto an entire surface of the result and embedded in the open hole O1. Afterwards, a node separation process may be performed to form a bottom electrode 120 having a cylindrical shape embedded in the open hole O1. The conductive layer that becomes the bottom electrode 120 may include any one of a metal nitride layer, a metal layer, or a combination of the metal nitride layer and the metal layer. For example, the conductive layer may include any one of titanium nitride (TiN), ruthenium (Ru), tantalum nitride (TaN), tungsten nitride (WN), platinum (Pt), or iridium (Ir). The conductive layer may be deposited via a chemical vapor deposition (CVD) method or an atomic layer deposition (ALD) method with a thickness of about 20 to about 100 nm.

A node separation process may remove the first sacrificial layer 141 via dry etchback or chemical mechanical polishing (CMP). The first sacrificial layer 141 may protect the support layer pattern 130*p*.

Adjacent bottom electrodes 120 may be insulated and separated from each other by the mold layer 125. When the shape of the open hole O1 has a slope such that the bottom CD is smaller than the top CD, the shape may be transcribed to the bottom electrode 120. Thus, the bottom electrode 120 may have a shape such that the bottom CD is smaller than the top CD. However, FIG. 8B illustrates a vertical shape for the sake of convenience. A bottom portion of the bottom electrode 120, having a shape of securely sitting in and conforming to the hole C1 arranged on a surface of the contact plug 111, may have a solid contact and be laminated. An outside wall of a top portion of the bottom electrode 120 may be fixed and supported by the support layer pattern 130*p*.

Referring to FIGS. 5, 9A and 9B, after a second sacrificial layer 145 has been formed by using the oxide layer, etc. on the entire surface in operation P1004, a photoresist pattern 146 is formed on the second sacrificial layer 145. In this case, the second sacrificial layer 145 may include oxide layers such as TEOS, BPSG, PSG, USG, SOD, and HDP. In succession, the second sacrificial layer 145 may be etched by using the photoresist pattern 146 as an etching mask and a portion of the support layer pattern 130*p* may be successively etched. As a result, in operation P1006, the open area Op may be formed in the cell block area BLK and a wave shape profile may be formed in the edge area EDGE with respect to the support layer pattern 130*p*, trimming the support layer pattern 130*p* in the edge area EDGE. Thus, the support layer pattern 130*p* may become the support structure pattern 130*a*.

The first profile pf1a, which is the horizontal cross-sectional profile of the support structure pattern 130a in the edge area EDGE, may include various shapes as described above with reference to FIGS. 1A through 1D. In addition, as described above, the first profile pf1a may partially include the wave shape having peaks and valleys formed in consideration of locations of the conductive contacts MC.

In addition, a portion of a surface of the bottom electrode 120 may be exposed via the open area Op formed on the cell block area BLK. In addition, the open area Op may be formed such that wet etchant flows therethrough in a subsequent wet etching process. Shapes and structures of the open area Op may vary as described above with reference to FIGS. 2A through 2F.

Figure 10B:
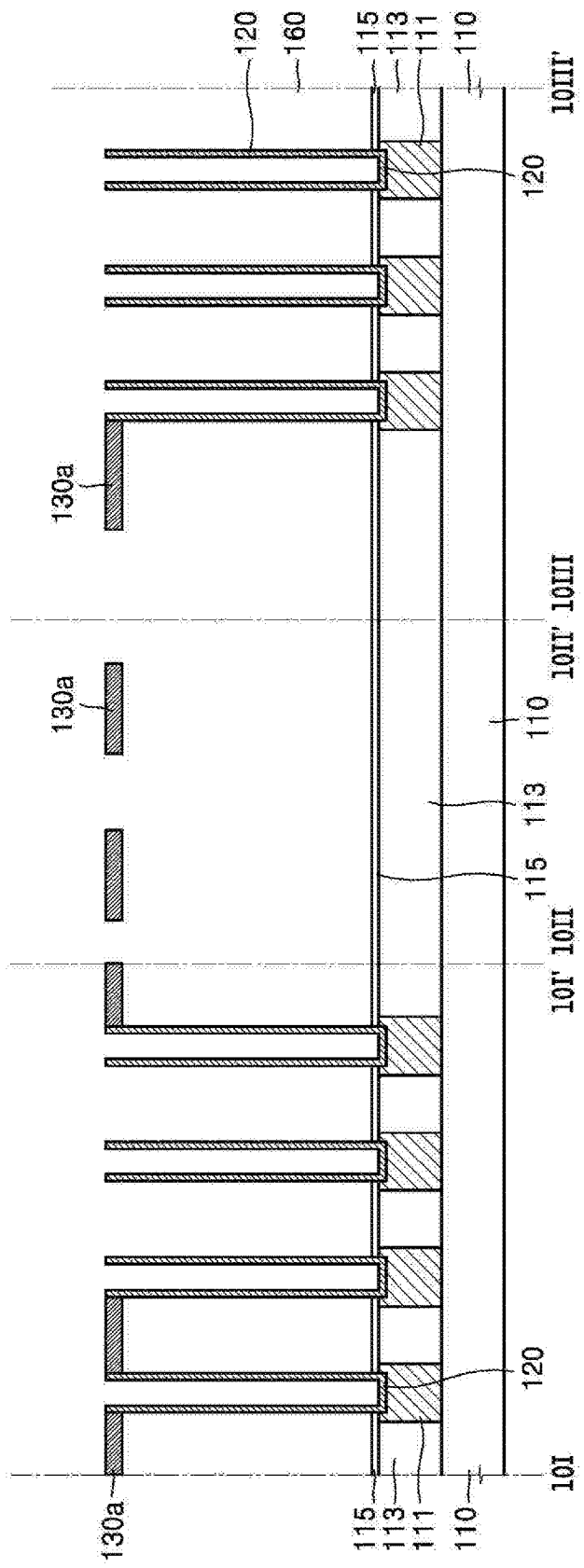
FIG. 10B is a cross-sectional view illustrating a forming process of a semiconductor memory device, according to an example embodiment.

Referring to FIGS. 5, 10A and 10B, the mold layer 125 may be totally removed via the wet etching process in operations P1006 and P1008. Since the mold layer 125 is the oxide layer, the wet etching process may be performed by using wet chemical such as hydrofluoric acid and buffered oxide etchant (BOE). The wet chemical may flow in through the open area Op formed in the support structure pattern 130a and etch the mold layer 125. The second sacrificial layer 145, which also includes oxide layer material, may be simultaneously removed in an etching process of the mold layer 125.

In the wet etching process, the support structure pattern 130a may not be etched and may maintain an original structure fixed solidly to prevent the bottom electrode 120 having a cylindrical shape from collapsing. In addition, the etching prevention layer 115 may prevent the wet etchant from infiltrating into a bottom structure of the pillar-type bottom electrode 120A.

Afterwards, referring to FIGS. 5, 3A and 3B, the conductive layer 150 and a plate electrode, that is, the top electrode 160 may be formed after the mold layer 125 has been removed in operation P1008. In this case, the conductive layer 150 and the top electrode 160 may be conformally formed in sequence on the support structure pattern 130a in the edge area EDGE. For example, the support structure pattern 130a in the edge area EDGE may protrude in a direction opposite to the cell block area BLK, and the conductive layer 150 and the plate electrode may be conformally deposited thereon. Accordingly, as illustrated in FIGS. 3A and 3B, the second profile pf2, which is the horizontal cross-sectional profile of the top electrode 160 in the edge area EDGE, may include the wave shape.

Figure 11:
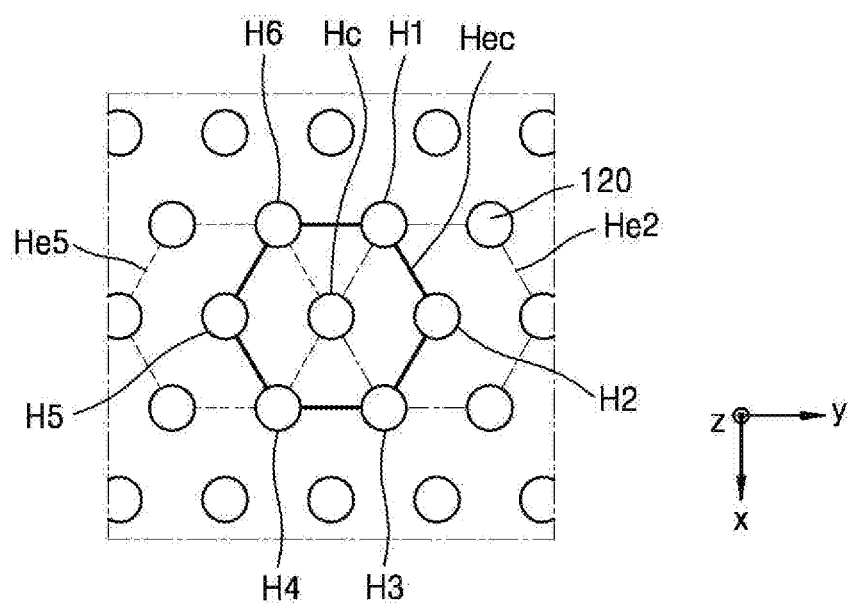
FIG. 11 is a conceptual view illustrating an arrangement of a honeycomb structure of bottom electrodes of a semiconductor memory device, according to an example embodiment.

FIG. 11 is a conceptual view illustrating an arrangement of a honeycomb structure of bottom electrodes of a semiconductor memory device according to an embodiment.

Referring to FIG. 11, bottom electrodes, that is, the bottom electrodes (e.g., bottom electrodes 120 in FIG. 1C) having a cylindrical shape of a semiconductor memory device may be arranged in a honeycomb structure according to an embodiment. The honeycomb structure may include a structure wherein the bottom electrodes 120 are arranged at vertices H1, H2, H3, H4, H5 and H6 of a hexagon, and at a center point Hc. The bottom electrodes 120 may be arranged in a structure such that the honeycomb structures continuously overlap each other along the first direction (the x-direction) and the second direction (the y-direction), as illustrated by the dashed, dashed dotted, and solid lines in FIG. 11.

In detail, the bottom electrode 120 may be arranged in a structure such that each of six vertices H1, H2, H3, H4, H5 and H6 of a center hexagon Hec (denoted as a solid line) may be respective center points of six adjacent hexagons, and the center point Hc of the center hexagon Hec is equally shared by the six adjacent hexagons. For example, a second vertex H2 may be a center point of a second hexagon He2 (denoted as a dashed dotted line), a fifth vertex H5 may be a center point of a fifth hexagon He5 (denoted as a dashed line), and the center point Hc of the center hexagon Hec may be shared as one of six vertices by the second hexagon He2 and the fifth hexagon He5.

A hexagon in a honeycomb structure of the bottom electrodes 120 may be a regular hexagon. In addition, all of six triangles sharing the center point Hc may be regular triangles. Accordingly, same gaps may be maintained between adjacent vertices, or between a vertex and a center point in one hexagon.

Since the bottom electrodes 120 are arranged in the honeycomb structure as described above, the bottom electrodes 120 may maintain certain gaps therebetween each other. Accordingly, conductive material and top electrode material may be conformally deposited in a subsequent process, and a semiconductor memory device including a capacitor with uniform performance may be realized.

In FIG. 11, each of the bottom electrodes 120 is illustrated as one circle, unlike two concentric circles illustrated in FIG. 1A, simply for the sake of convenience. The bottom electrodes 120 may have a certain thickness as illustrated in FIGS. 12 through 16.

Figure 13:
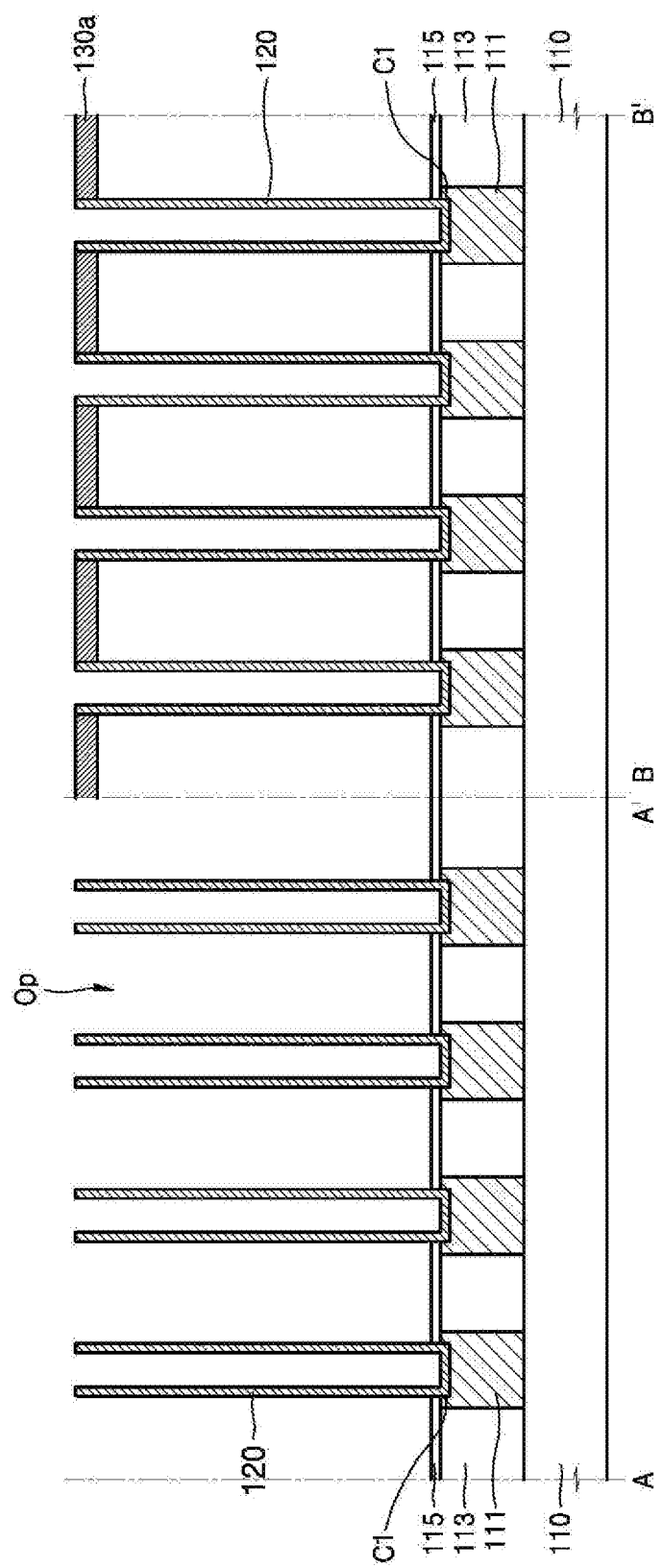
FIG. 13 is a cross-sectional view of bottom electrodes of a semiconductor memory device according to an example embodiment.

FIG. 12 is a perspective view of bottom electrodes of a semiconductor memory device according to an embodiment. FIG. 13 illustrates cross-sectional views of FIG. 12, cut along lines A-A' and the B-B'.

Referring to FIGS. 12 and 13, the semiconductor memory device may include an interlayer insulating layer 113 embedding the plurality of contact plugs 111 on the substrate 110 according to an embodiment. For example, the plurality of contact plugs 11 may be formed in the interlayer insulating layer 113. A plurality of storage electrodes having a cylindrical shape connected to respective contact plugs 111 (i.e., the plurality of bottom electrodes 120) may be formed on the interlayer insulating layer 113. The etching prevention layer 115 may be formed on the interlayer insulating layer 113. The etching prevention layer 115 may be formed of, for example, silicon nitride (SiN).

The substrate 110 may include, for example, a silicon substrate, a silicon-on-insulator (SOI) substrate, a silicon germanium substrate, a gallium-arsenic substrate, a ceramic substrate, a crystal substrate, and a display glass substrate. Unit devices (not illustrated), for example, various kinds of active devices or passive devices may be formed on the substrate 110 which are needed for forming semiconductor memory devices. Accordingly, the substrate 110 may include an impurity area. The substrate 110 may include a landing contact (not illustrated). Depending on the case, the landing contact may be arranged between the bottom electrode 120 and the contact plug 111.

The contact plug 111 may include a polysilicon layer or a metal conductive layer, and may further include barrier metals such as titanium (Ti) or Ti/titanium nitride (TiN) thereon.

The bottom electrode 120 may include any one of the metal nitride layer, the metal layer, or a combination of the metal nitride layer and the metal layer. For example, the bottom electrode 120 may include any one of TiN, Ru, TaN, WN, Pt, or Ir. The bottom electrode 120 may have a high aspect ratio, as illustrated. For example, the aspect ratio of the bottom electrode 120 may be about 10 to about 30. In addition, a width of the bottom electrode 120 may be approximately about 20 nm to about 100 nm, and a height of the bottom electrode 120 may be approximately about 500 nm to about 4000 nm. However, the structure of the bottom electrode 120 of the present embodiment is not limited thereto.

The bottom electrode 120 may have a structure where the bottom electrode 120 securely settles in the hole C1 formed in the contact plug 111 via lamination. Alternatively, the hole C1 may not be formed in the contact plug 111 and the bottom electrode 120 may be laminated onto the contact plug 111 without the hole C1.

An integrated support structure pattern including an open area as illustrated in FIGS. 1A through 2C may be formed at a top end portion of the bottom electrode 120, to prevent collapse of the bottom electrode 120 in a semiconductor memory device according to an embodiment.

Figure 14:
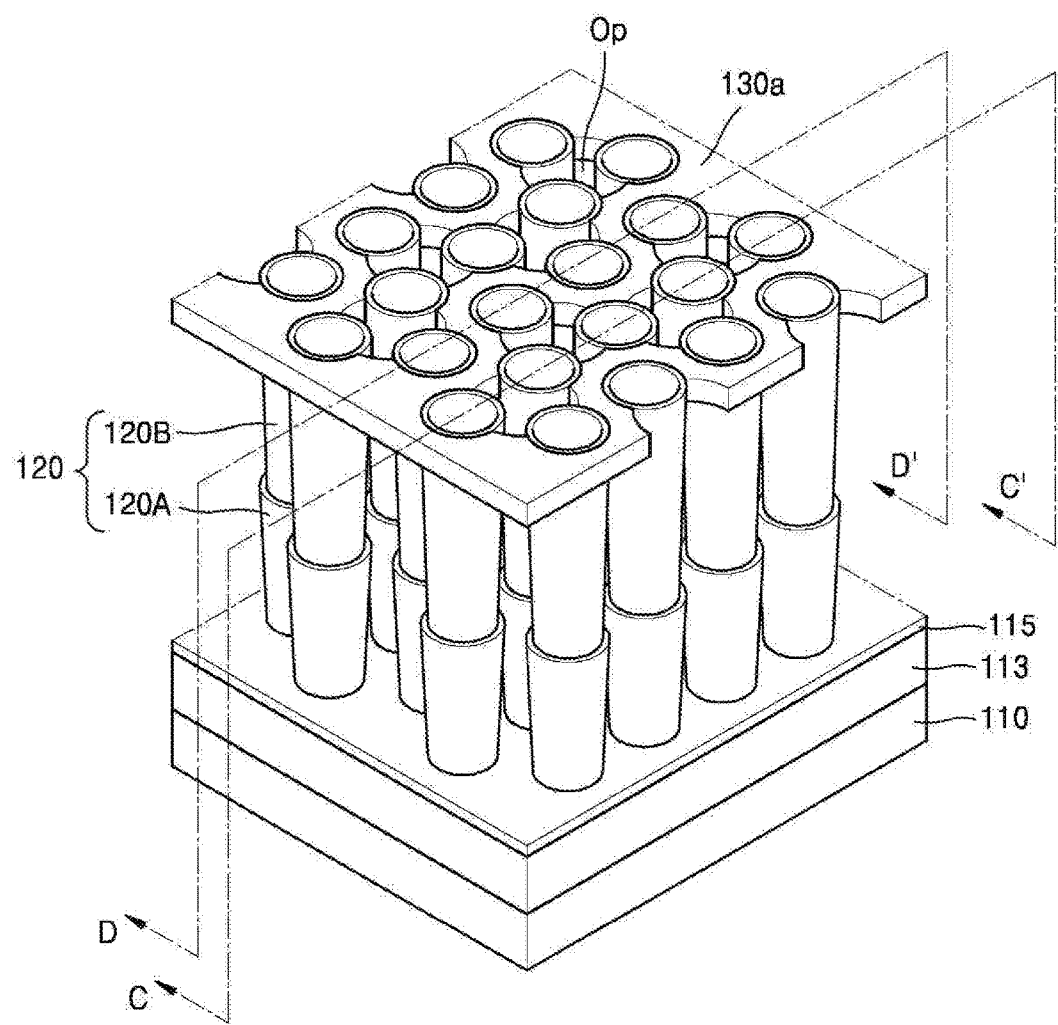
FIG. 14 is a perspective view of bottom electrodes of a semiconductor memory device according to an example embodiment.
Figure 15:
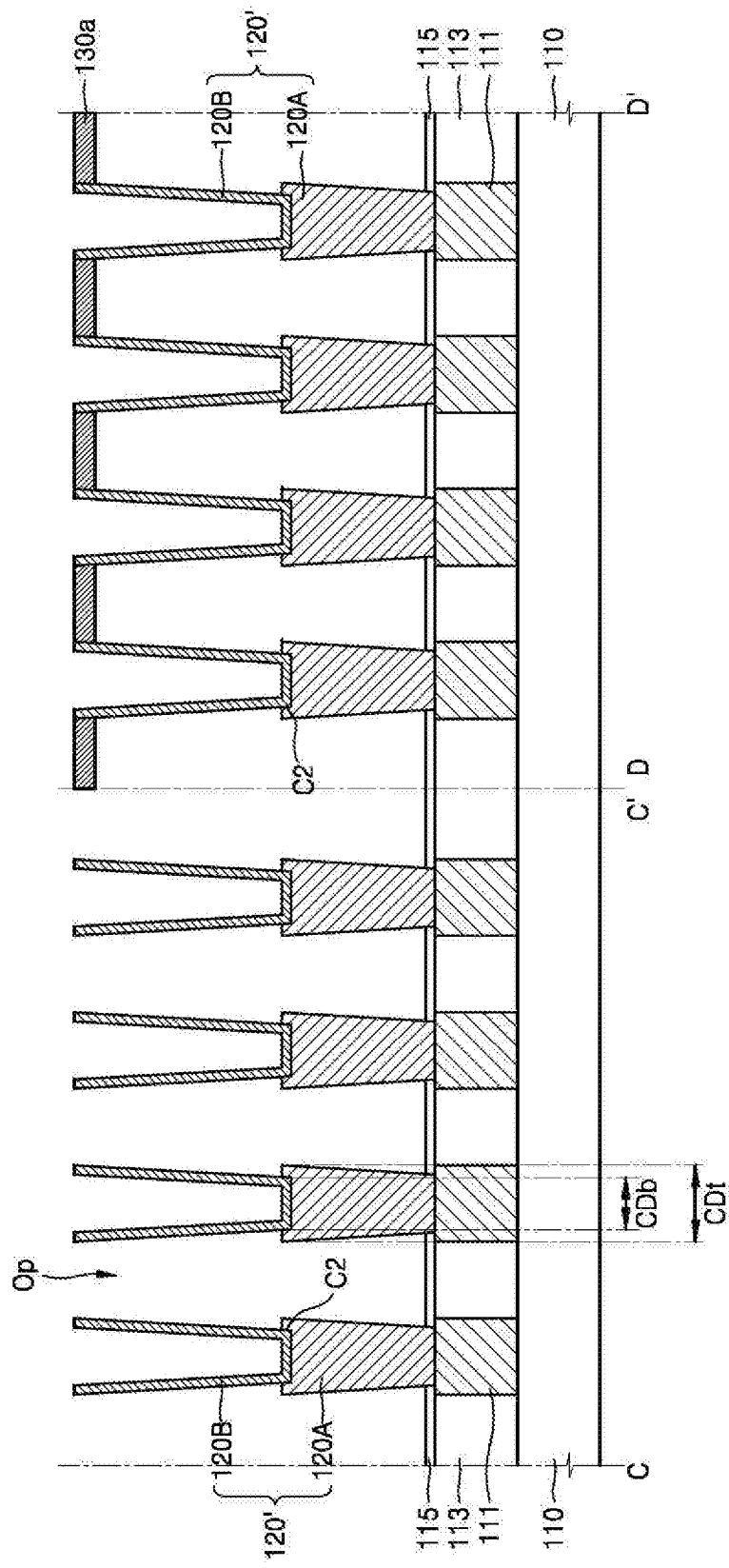
FIG. 15 is a cross-sectional view of bottom electrodes of a semiconductor memory device according to an example embodiment.

FIG. 14 is a perspective view of bottom electrodes of a semiconductor memory device according to an embodiment. FIG. 15 illustrates cross-sectional views of FIG. 14, cut along lines C-C' and D-D'. Descriptions provided above with reference to FIGS. 12 and 13 will be simply provided or omitted for the sake of convenience.

Referring to FIGS. 14 and 15, a plurality of bottom electrodes 120' connected to respective contact plugs 111 on the interlayer insulating layer 113 on the substrate 110 may be formed. The bottom electrode 120' may include a pillar-type bottom electrode 120A and a cylinder-type bottom electrode 120B.

In detail, the bottom electrode 120' may include a two-story structure wherein the pillar-type bottom electrode 120A and the cylinder-type bottom electrode 120B are laminated. A bottom side of the pillar-type bottom electrode 120A may be supported by the etching prevention layer 115 and the top CDt of the pillar-type bottom electrode 120A may be larger than the bottom CDb of the cylinder-type bottom electrode 120B. Depending on the case, the top CDt of the pillar-type bottom electrode 120A may be the same as or smaller than the bottom CDb of the cylinder-type bottom electrode 120B.

A hole C2 may be arranged on a top surface of the pillar-type bottom electrode 120A, and the cylinder-type bottom electrode 120B may be laminated onto the pillar-type bottom electrode 120A in a structure such that a bottom portion of the cylinder-type bottom electrode 120B securely settles in the hole C2. Alternatively, the cylinder-type bottom electrode 120B may be arranged in a simple lamination method without the hole C2. Heights of the pillar-type bottom electrode 120A and the cylinder-type bottom electrode 120B may be the same as each other, or any one height of them may be lower than the other. The height of each bottom electrode 120' may be in a range of about 200 nm to about 2000 nm. However, the height of respective bottom electrodes 120' is not limited thereto. The bottom electrode 120' may include any one of the metal nitride layer, the metal layer, or a combination of the metal nitride layer and the metal layer. For example, the bottom electrode 120' may include any one of, for example, TiN, Ru, TaN, WN, Pt, or Ir.

When a capacitor is formed by using the bottom electrode 120' which is a combination of a pillar-type structure and a cylinder-type structure together, larger capacitance may be obtained than a capacitor using only the pillar-type bottom electrode 120A with the same bottom height. In addition, when capacitance that is the same as the capacitance obtained by a capacitor using only the pillar-type bottom electrode 120A is assumed to be pursued, the capacitance may be obtained by the cylinder-type structure (e.g., cylinder-type bottom electrode 120B). Accordingly, a structure wherein the height of the bottom electrodes 120' does not need to be increased may contribute to prevention of collapsing of the bottom electrodes 120'.

While the concepts have been particularly shown and described with reference to embodiments thereof, it will be understood that various changes in form and details may be made therein without departing from the spirit and scope of the following claims.

What is claimed is:

1. A semiconductor memory device, the semiconductor memory device comprising:
   a substrate having a cell area defined thereon, the cell area including a cell block area and an edge area:
   a plurality of bottom electrodes formed on the substrate, wherein the plurality of bottom electrodes are arranged in rows that extend in a first direction parallel with a top surface of the substrate, arranged in columns that extend in a second direction parallel with the top surface of the substrate and perpendicular to the first direction; and
   a support structure pattern having a flat plate shape, wherein the support structure pattern connects the bottom electrodes to each other, supports the bottom electrodes on the substrate, and comprises a plurality of open areas,
   wherein a first profile, which is a horizontal cross-sectional outermost profile of the support structure pattern, from a plan view, has a wave shape in the edge area of the support structure pattern.

2. The semiconductor memory device of claim 1, wherein the plurality of bottom electrodes are arranged at six vertices and a center point of a hexagon pattern to form a honeycomb structure, and the honeycomb structure has a structure where the six vertices and the center point of the hexagon pattern form a first hexagonal structure, and
   wherein each of the six vertices of the first hexagonal structure becomes a center point of each of six hexagonal structures that are different from each other, and the center point of the first hexagonal structure is shared as one of six hexagonal vertices of each of the six hexagonal structures that are different from each other.

3. The semiconductor memory device of claim 2, wherein locations of center points of the outermost bottom electrodes in the cell block area correspond to a concavo-convex shape of the first profile.

4. The semiconductor memory device of claim 1, further comprising:
   a top electrode on the support structure pattern and the bottom-electrodes,
   wherein a second profile, which is a horizontal cross-sectional profile of the top electrode, from a plan view, has a wave shape in the edge area of the top electrode.

5. The semiconductor memory device of claim 4,
   wherein a concavo-convex shape of the second profile corresponds to a concavo-convex shape of the first profile,
   wherein the first profile includes a plurality of first vertices disposed nearer to the cell block area and a plurality of second vertices spaced farther from the cell block area than the plurality of first vertices, and the second profile includes a plurality of third vertices disposed nearer to the cell block area and a plurality of fourth vertices spaced farther from the cell block area than the plurality of third vertices, wherein the third vertices are aligned with the first vertices and the fourth vertices are aligned with the second vertices.

6. The semiconductor memory device of claim 4, wherein the wave shapes of the first profile and the second profile comprise triangular wave shapes.

7. The semiconductor memory device of claim 6, wherein, when a distance between centers of adjacent bottom electrodes is about 3.0 F, a differential value of the triangular wave shapes is about 1.5 F, where F denotes a minimum lithographic feature size, and wherein the differential value is a difference between minimum and maximum amplitudes.

8. The semiconductor memory device of claim 4, further comprising:

a peripheral circuit area defined on the substrate; and at least one conductive contact formed in the peripheral circuit area, wherein the at least one conductive contact is arranged to correspond in the second direction to a concave portion of the second profile that is concave in a direction of the cell block area of the top electrode.

9. The semiconductor memory device of claim 8, wherein portions of the second profile corresponding to locations of the at least one conductive contact have wave shapes.

10. The semiconductor memory device of claim 8, wherein a horizontal distance from the top electrode to the at least one conductive contact is equal to or more than about 245 nm.

11. A semiconductor memory device, the semiconductor memory device comprising:

a first bottom electrode array which comprises first bottom electrodes separated from each other by a first gap along a first direction on a substrate and separated from each other by a second gap along a second direction perpendicular to the first direction;

a second bottom electrode array which comprises second bottom electrodes separated from each other by a third gap along the first direction on the substrate and separated from each other by a fourth gap along the second direction between adjacent first bottom electrodes of the first bottom electrode array; and a support structure pattern on the substrate between the first bottom electrodes and the second bottom electrodes, wherein the first bottom electrodes and the second bottom electrodes are misaligned relative to each other with respect to the first direction, and wherein horizontal distances along the second direction from the outermost first and second bottom electrodes to an outermost perimeter of the support structure pattern are the same.

12. The semiconductor memory device of claim 11, wherein the first gap and the third gap are the same, and the second gap and the fourth gap are the same.

13. The semiconductor memory device of claim 11, further comprising:

a top electrode formed on the support structure pattern and the first and second bottom electrodes, wherein a horizontal distance along the second direction from the outermost perimeter of the support structure pattern to an outermost perimeter of the top electrode is fixed.

14. The semiconductor memory device of claim 11, wherein the first and second bottom electrodes form a honeycomb structure, and the honeycomb structure has a structure where six vertices and a center point of a hexagon pattern form a first hexagonal structure, and wherein each of the six vertices of the first hexagonal structure becomes a center point of six adjacent hexagonal structures that are different from each other, and the center point of the first hexagonal structure is shared as one of the hexagonal vertices of the six adjacent hexagonal structures that are different from each other.

15. The semiconductor memory device of claim 14, wherein when a distance between centers of adjacent bottom electrodes is about 3.0 F, the outermost perimeter of the support structure pattern comprises unit segments having lengths of about 3.0 F, where F denotes a minimum lithographic feature size.

16. A semiconductor memory device, the device comprising:

a substrate having a cell area defined thereon, the cell area including a cell block area and an edge area extending around a perimeter of the cell block area;

a first bottom electrode array which comprises first bottom electrodes separated from each other by a first gap along a first direction on the substrate and separated from each other by a second gap along a second direction perpendicular to the first direction;

a second bottom electrode array which comprises second bottom electrodes separated from each other by a third gap along a first direction on the substrate and separated from each other by a fourth gap along the second direction between adjacent first bottom electrode arrays; and a support structure pattern having a flat plate shape, the support structure pattern being in contact with upper sidewalls of the first and second bottom electrodes, which physically connects the first bottom electrodes and the second bottom electrodes, and supports the first and second bottom electrodes on the substrate, wherein a first profile, which is a horizontal cross-sectional outermost profile in the edge area of the support structure pattern, has a wave shape comprised of linear segments.

17. The semiconductor memory device of claim 16, wherein the first bottom electrodes and the second bottom electrodes are misaligned relative to each other with respect to the first direction.

18. The semiconductor memory device of claim 16, wherein a first horizontal distance from an outermost first bottom electrode to an outermost perimeter of the support structure pattern is equal to a second horizontal distance from an outermost second bottom electrode to the outermost perimeter of the support structure pattern.

19. The semiconductor memory device of claim 16, wherein the wave shape is a regular repeated pattern of line segments.

20. The semiconductor memory device of claim 16, wherein the first gap and the second gap are distances between centers of adjacent first bottom electrodes in the first direction and the second direction, respectively, and wherein the third gap and the fourth gap are distances between centers of adjacent second bottom electrodes in the first direction and the second direction, respectively.

* * * * *